(12) United States Patent
Chapman et al.

(10) Patent No.: US 8,017,471 B2
(45) Date of Patent: Sep. 13, 2011

(54) STRUCTURE AND METHOD OF LATCHUP ROBUSTNESS WITH PLACEMENT OF THROUGH WAFER VIA WITHIN CMOS CIRCUITRY

(75) Inventors: Phillip F. Chapman, Colchester, VT (US); David S. Collins, Williston, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 380 days.

(21) Appl. No.: 12/186,802

(22) Filed: Aug. 6, 2008

(65) Prior Publication Data

US 2010/0032767 A1 Feb. 11, 2010

(51) Int. Cl.
*H01L 21/8238* (2006.01)
(52) U.S. Cl. ........ 438/221; 438/199; 438/218; 438/558; 438/561; 438/618; 438/621
(58) Field of Classification Search .................. 438/199, 438/294, 618, 621, 542, 558, 561, 643, 218, 438/219, 221; 257/372, 394, 621, E27.063
See application file for complete search history.

(56) References Cited

U.S. PATENT DOCUMENTS

| | | | |
|---|---|---|---|
| 6,228,726 B1 | 5/2001 | Liaw | |
| 6,864,156 B1 | 3/2005 | Conn | |
| 7,064,391 B1 | 6/2006 | Conn | |
| 7,075,133 B1* | 7/2006 | Padmanabhan et al. | 257/276 |
| 7,176,128 B2* | 2/2007 | Ahrens et al. | 438/643 |
| 7,402,866 B2* | 7/2008 | Liang et al. | 257/347 |
| 7,498,622 B1 | 3/2009 | Chapman et al. | |
| 2003/0197242 A1* | 10/2003 | Chen et al. | 257/509 |
| 2003/0203546 A1 | 10/2003 | Burbach et al. | |
| 2003/0214348 A1 | 11/2003 | Singh et al. | |
| 2007/0170543 A1* | 7/2007 | Furukawa et al. | 257/520 |
| 2007/0196976 A1* | 8/2007 | Saiki | 438/231 |
| 2007/0228487 A1 | 10/2007 | Voldman | |
| 2009/0152632 A1 | 6/2009 | Chapman et al. | |

* cited by examiner

*Primary Examiner* — Charles Garber
*Assistant Examiner* — Bryan R Junge
(74) *Attorney, Agent, or Firm* — Richard Kotulak; Roberts Mlotkowski Safran & Cole, P.C.

(57) ABSTRACT

A method of manufacturing a semiconductor structure includes: forming a trench in a back side of a substrate; depositing a dopant on surfaces of the trench; forming a shallow trench isolation (STI) structure in a top side of the substrate opposite the trench; forming a deep well in the substrate; out-diffusing the dopant into the deep well and the substrate; forming an N-well and a P-well in the substrate; and filling the trench with a conductive material.

19 Claims, 24 Drawing Sheets

STRUCTURE AND METHOD OF LATCHUP ROBUSTNESS WITH PLACEMENT OF THROUGH WAFER VIA WITHIN CMOS CIRCUITRY

FIELD OF THE INVENTION

The invention relates to integrated circuits, and more particularly, to structures and methods for providing latchup robustness in integrated circuits.

BACKGROUND

Noise isolation and the elimination of complementary metal-oxide semiconductors (CMOS) latchup are significant issues in advanced CMOS technology, radio frequency (RF) CMOS, and bipolar CMOS (BiCMOS) Silicon Germanium (SiGe) technology. Latchup conditions typically occur within peripheral circuits or internal circuits, within one circuit (intra-circuit), or between multiple circuits (inter-circuit). In one such example, latchup occurs when a PNPN structure transitions from a low current high voltage state to a high current low voltage state through a negative resistance region (i.e., forming an S-Type I-V (current/voltage) characteristic).

In particular, latchup is known to be initiated by an equivalent circuit of a cross-coupled PNP and NPN transistor. With the base and collector regions being cross-coupled, current flows from one device leading to the initiation of the second device ("regenerative feedback"). These PNP and NPN elements can be any diffusions or implanted regions of other circuit elements (e.g., p-channel MOSFETs, n-channel MOSFETs, resistors, etc.) or actual pnp and npn bipolar transistors. In CMOS structures, the pnpn structure can be formed with a p-diffusion in a n-well, and a n-diffusion in a p-substrate ("parasitic PNPN"). In this case, the well and substrate regions are inherently involved in the latchup current exchange between regions in the device.

The condition for triggering a latchup is a function of the current gain of the PNP and NPN transistors, and the resistance between the emitter and the base regions. This inherently involves the well and substrate regions. The likelihood or sensitivity of a particular pnpn structure to latchup is a function of a same combination of spacing (e.g., base width of the NPN and base width of the PNP), current gain of the transistors, substrate resistance and spacings, the well resistance and spacings, and isolation regions.

Latchup can also occur as a result of the interaction of an electrostatic discharge (ESD) device, the input/output (I/O) off-chip driver and adjacent circuitry initiated in the substrate from the overshoot and undershoot phenomena. These factors can be generated by CMOS off-chip driver circuitry, receiver networks, and ESD devices. In CMOS I/O circuitry, undershoot and overshoot can lead to injection in the substrate, and simultaneous switching of circuitry where overshoot or undershoot injection occurs may lead to both noise injection and latchup conditions. Also, supporting elements in these circuits, such as pass transistors, resistor elements, test functions, over voltage dielectric limiting circuitry, bleed resistors, keeper networks and other elements can be present, contributing to noise injection into the substrate and latchup.

With the scaling of standard CMOS technology, the spacing of the p+/n+ space decreases, leading to a lower trigger condition and the onset of CMOS latchup. With the scaling of the shallow trench isolation (STI) for aspect ratio, the vulnerability of CMOS technology to latchup has increased. Vertical scaling of the wells, and lower n-well and p-well implant doses also has increased the lateral parasitic bipolar current gains, leading to lower latchup robustness.

With the transition from p+ substrates to low doped p-substrates, the latchup robustness has continued to decrease. Also, the effectiveness of n-wells as guard ring structures may reduce internal and external latchup problems. But, with mixed signal applications and radio frequency (RF) chips, a higher concern for noise reduction has lead to the continued lowering of the substrate doping concentration. This continues to lead to lower latchup immunity in mixed signal applications and RF technologies.

Latchup also can occur from voltage or current pulses that occur on the power supply lines. Transient pulses on power rails (e.g., substrate or wells) can trigger latchup processes. Latchup can also occur from a stimulus to the well or substrate external to the region of a thyristor structure from minority carriers.

Latchup can be initiated from internal or external stimulus, and is known to occur from single event upsets (SEU), which can include terrestrial emissions from nuclear processes, and cosmic ray events, as well as events in space environments. Cosmic ray particles can include proton, neutron, and gamma events, as well as a number of particles that enter the earth atmosphere. Terrestrial emissions from radioactive events, such as alpha particles, and other radioactive decay emissions can also lead to latchup in semiconductors.

For military, surveillance, satellite, and other outer space applications, it is desirable to have a high tolerance to latchup. Latchup can lead to failure of space applications triggered by cosmic rays, heavy ions, proton and neutron events. The higher the latchup margin in military and outer space applications, the higher the vulnerability to single even upset (SEU) initiated latchup.

Accordingly, there exists a need in the art to overcome the deficiencies and limitations described hereinabove.

SUMMARY

In a first aspect of the invention, a method of manufacturing a semiconductor structure comprises: forming a trench in a back side of a substrate; depositing a dopant on surfaces of the trench; forming a shallow trench isolation (STI) structure in a top side of the substrate opposite the trench; forming a deep well in the substrate; out-diffusing the dopant into the deep well and the substrate; forming an N-well and a P-well in the substrate; and filling the trench with a conductive material.

The method may comprise removing excess dopant from the trench. In embodiments, out-diffusing creates an electrical contact at an interface of the trench and the deep well, and a high voltage junction at an interface of the trench and the substrate.

The trench may extend to a bottom surface of the shallow trench isolation structure. In embodiments, the deep well is a deep N-well, and the trench extends through the N-well, the deep N-well, and the substrate.

The method may comprise forming a trench isolation (TI) structure through the STI structure. The TI structure may extend between the N-well and the P-well, into the deep well, and to an upper surface of the trench. The method may further comprise lining surfaces of the trench with a barrier material before the filling.

In another aspect of the invention, a method of manufacturing a semiconductor structure comprises: forming a deep trench (DT) structure in a substrate; forming a shallow trench isolation (STI) structure over the DT structure; forming a trench in a back side of the substrate opposite the DT and STI structure; depositing a dopant on surfaces of the trench; forming a deep well in the substrate; out-diffusing the dopant into the deep well and the substrate; forming an N-well and a P-well in the substrate; and filling the trench with a conductive material.

In another aspect of the invention, a method includes: forming an NFET device having a P-well at a top side of a substrate; forming a PFET device having an N-well at the top side of the substrate; and forming a through wafer via from a backside of the substrate to a bottom surface of an isolation structure located between the NFET device and the PFET device.

In another aspect of the invention, a semiconductor structure comprises: an NFET device having a P-well at a top side of a substrate; a PFET device having an N-well at the top side of the substrate; and a substrate contact comprising a through wafer via extending from a backside of the substrate to a bottom surface of an isolation structure located between the NFET device and the PFET device. The substrate contact is arranged to prevent formation of a parasitic circuit.

In another aspect of the invention, a semiconductor structure includes: an NFET device having a P-well at a top side of a substrate; a PFET device having an N-well at the top side of the substrate; a deep well formed in the substrate below the N-well and the P-well; a through wafer via extending from a backside of the substrate to a bottom surface of an isolation structure; an electrical connection region between the through wafer via and the deep well; and a high voltage junction between the through wafer via and the substrate.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits, and more particularly, to structures and methods for providing latchup robustness in integrated circuits. In embodiments, a through wafer via (TWV) is formed from the back side of a wafer to an isolation feature between the P-well and N-well of a chip. The isolation feature may be, for example, a shallow trench isolation (STI), trench isolation (TI), or deep trench (DT) feature.

Figure 1:
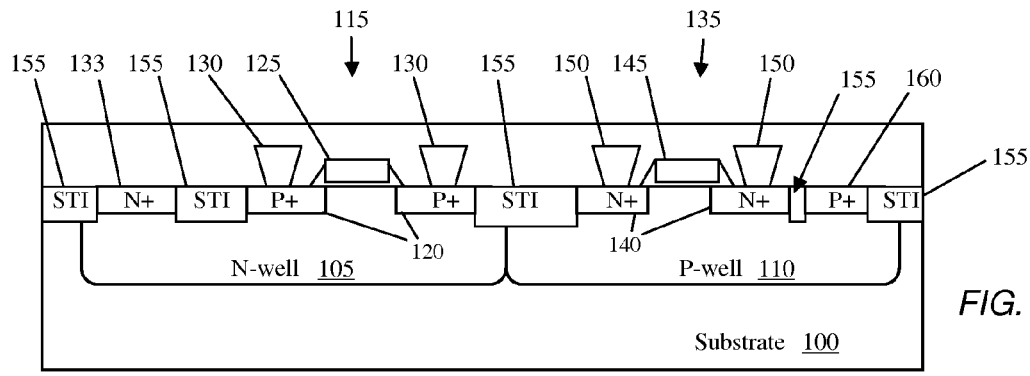
FIGS. 1-4 show semiconductor structures having a substrate contact formed at the upper surface of the substrate.
Figure 2:
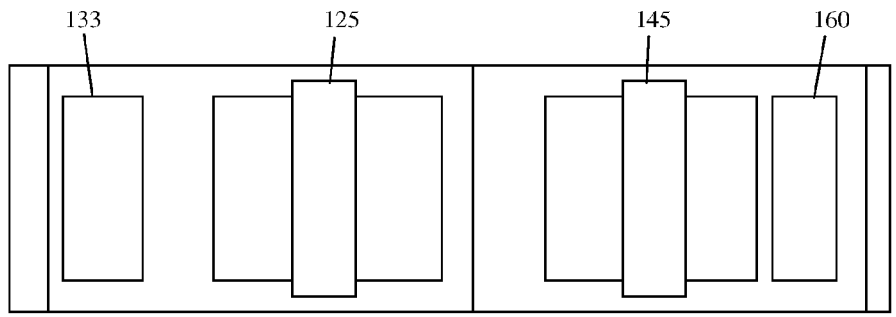

FIG. 1 is a cross section of an integrated circuit, in which a substrate 100 has an N-well 105 and a P-well 110 formed therein. PFET device 115 includes source and drain regions 120 formed in the N-well 105, gate 125, source/drain contacts 130, and N-well contact 133. NFET device 135 includes source and drain regions 140 formed in the P-well 110, gate 145, and source/drain contacts 150. Shallow trench isolation (STI) regions 155 separate the PFET 115 and the NFET 135, and define areas of the circuit. NFET 135 also includes a P+ substrate contact 160 formed at the upper surface of the substrate 100. As depicted in FIG. 2, which is a plan view of portions of the integrated circuit of FIG. 1, the P+ substrate contact 160 adds to the footprint (e.g., size) of the integrated circuit, by virtue of its being formed at the top surface of the substrate 100.

Figure 3:
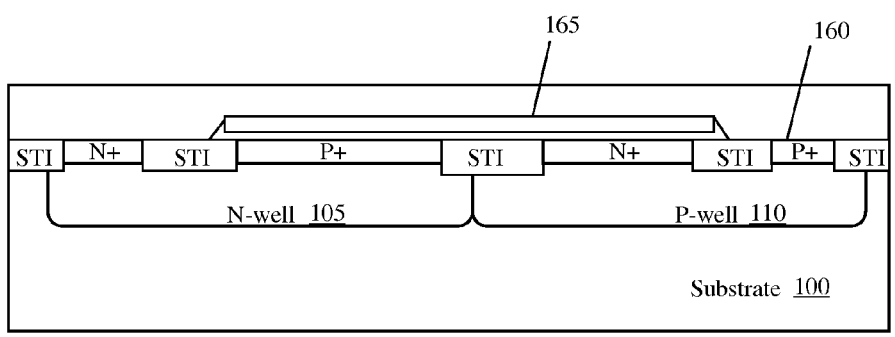
Figure 4:
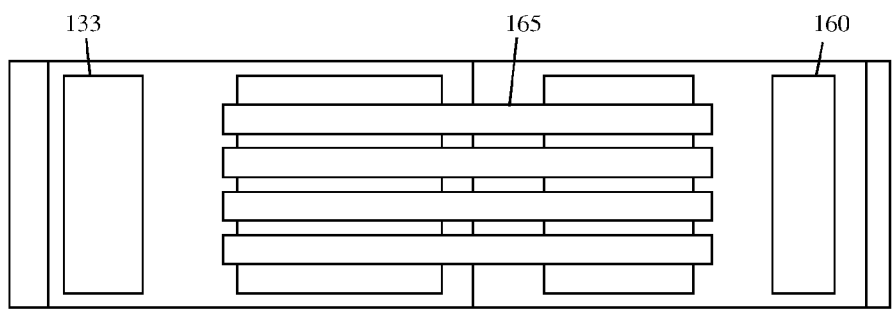

FIG. 3 is a cross section of an integrated circuit that comprises a gate array, in which gates 165 span the N-well 105 and P-well 110 formed in the substrate 100. Similar to FIG. 1, the integrated circuit includes a P+ substrate contact 160 that, as depicted in FIG. 4, adds to the footprint of the integrated circuit. In addition to increasing the footprint of the integrated circuit, substrate contacts formed at the upper surface of the substrate are subject to CMOS latchup due to the location of the substrate contact (e.g., outside the interface between the PFET and the NFET). Moreover, substrate contacts formed at the upper surface of the substrate disadvantageously interfere with the direction of the polysilicon gates.

Figure 5:
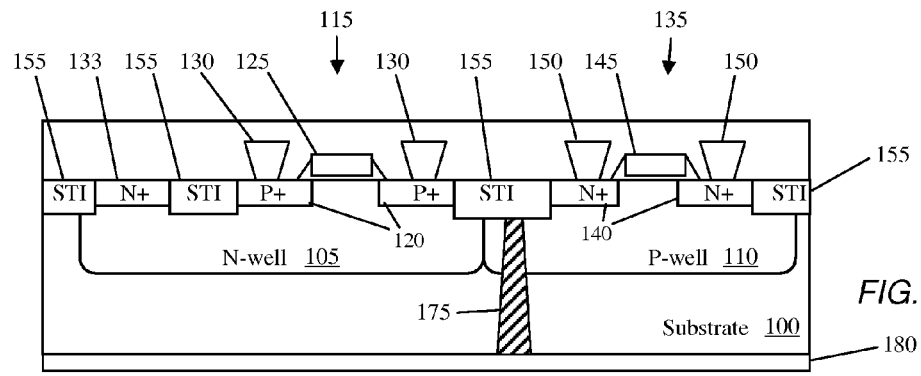
FIGS. 5-28 show semiconductor structures in accordance with aspects of the invention.

According to aspects of the invention, CMOS latchup performance can be improved by replacing the surface-located substrate contact with a through wafer via (TWV) located between the NFET and the PFET and wired to the back side of the wafer. For example, FIG. 5 shows a cross section of an integrated circuit according to aspects of the invention. In FIG. 5, and all other figures herein, like reference numerals represent similar features as those already described. In embodiments, the integrated circuit comprises a through wafer via (TWV) 175 formed between the NFET 135 and the N-well 105. In particular embodiments, the TWV 175 extends from the bottom of the substrate 100 (e.g., the back side of the wafer) to a lower surface of an STI 155 formed between the NFET 135 and the PFET 115. The TWV 175 may be composed of materials such as, but not limited to: doped polysilicon, tungsten, titanium, tantalum, or combinations thereof. According to aspects of the invention, the material of the TWV 175 is chosen to create an electrical contact between the TWV 175 and the P-well 110. In further embodiments, the TWV 175 may be in contact with a conductive layer 180 formed on the back side of the wafer. The conductive layer 180 may comprise, but is not limited to: doped polysilicon, tungsten, titanium, tantalum, aluminum, platinum, nickel, cobalt, metal silicide, or combination thereof.

By utilizing the TWV 175 (and, optionally, the conductive layer 180) the substrate contact (e.g., 160 shown in FIG. 1) may be eliminated from the top side of the integrated circuit, and effectively moved to a location between the NFET 135 and the PFET 115. In this manner, CMOS internal latchup is improved because of the elimination of the lateral NPN transistor current gain with the placement of the contact (e.g., the TWV) between the N-well and the NFET. With the presence of the TWV, no parasitic npn bipolar transistor occurs. Without the parasitic npn transistor, CMOS latchup can not occur. Also, CMOS latchup minority recombination improves due to through wafer via structure. Minority carriers recombine at the insulating or metal interface caused by a TWV. Recombination lowers the parasitic bipolar current gain, and hence improves the latchup robustness. Furthermore, CMOS latchup is improved due to reduced substrate shunt resistance due to reduced substrate spacing contact (e.g. substrate-to-NFET spacing contact) and low resistance TWV shunt; this prevents forward biasing of the npn emitter-base junction. Moreover, using the TWV as a substrate contact located between the PFET and NFET and back-side wired provides low resistance. Additionally, the through wafer via is wired on the back side of the wafer providing very low resistance shunt.

According to aspects of the invention, the TWV 175 is adjacent to or extends through the P-well 110, but does not contact the N-well 105. In this manner, the TWV 175 helps prevent latchup by preventing formation of a parasitic lateral PNPN device comprising source/drain 120, source/drain 140, P-well 110, and N-well 105. In FIG. 5, the substrate is P-type; however, it should be understood that in the arrangement shown in FIG. 5, and in all other arrangements described herein, the substrate may be N-type, with the TWV 175 formed adjacent to or through the N-well instead of the P-well.

Figure 6:
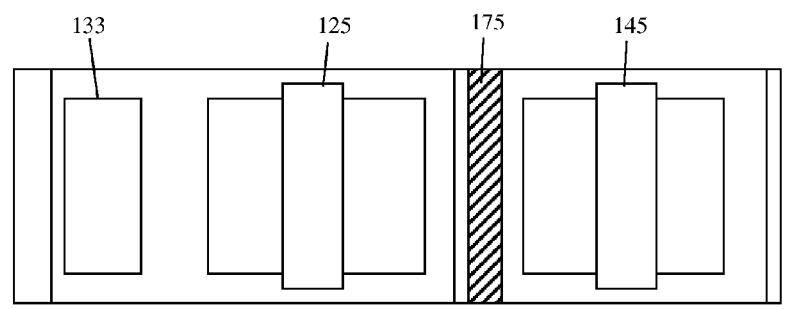
Figure 7:
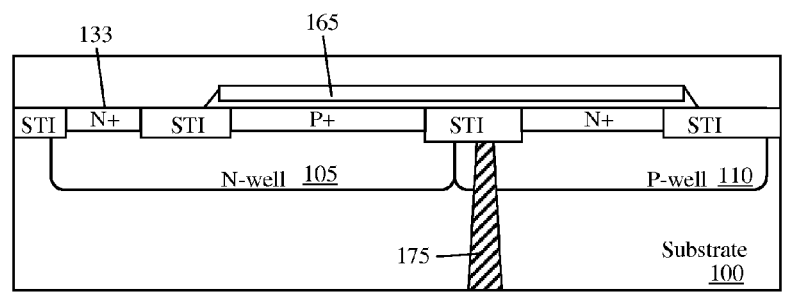
Figure 8:
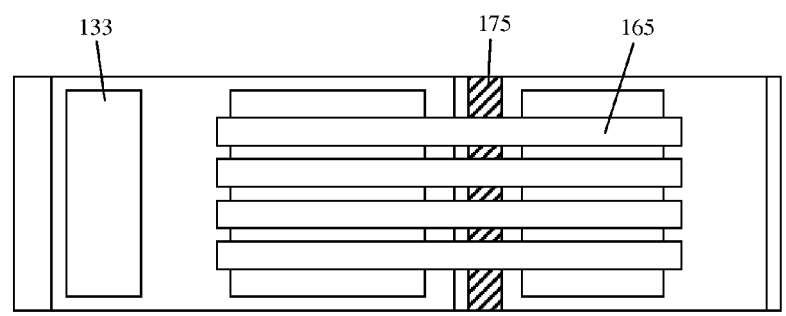

FIG. 6 is a plan view of portions of the integrated circuit shown in FIG. 5. As can be seen from FIG. 6, the TWV 175 is formed between the NFET (e.g., gate 145) and the PFET (e.g., gate 125). FIGS. 7 and 8 are a cross section and plan view, respectively, of portions of an integrated circuit having a gate array according to aspects of the invention. As depicted in FIGS. 7 and 8, the TWV 175 may be located between the N+ source/drain region 140 (as in FIG. 5) of the NFET 135 and the N-well 105 of the PFET 115. Although not shown, a conductive layer 180 may be formed on the back side of the wafer in this embodiment, and all other embodiments described herein.

Figure 9:
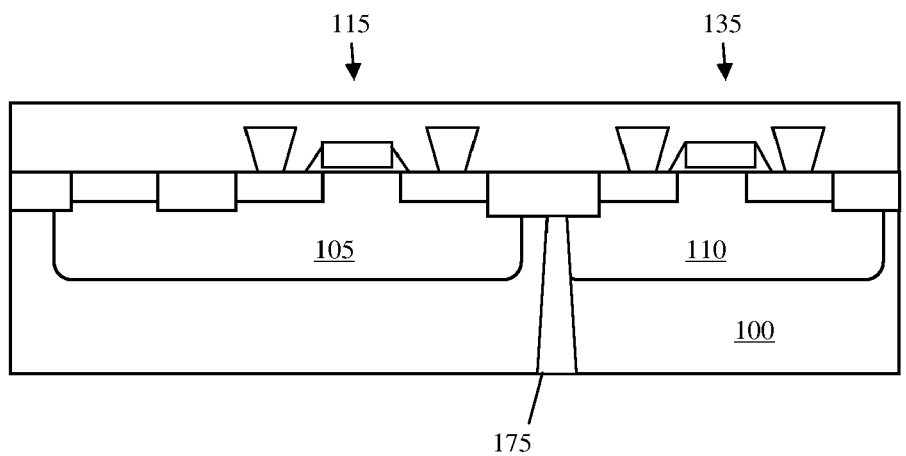
Figure 10:
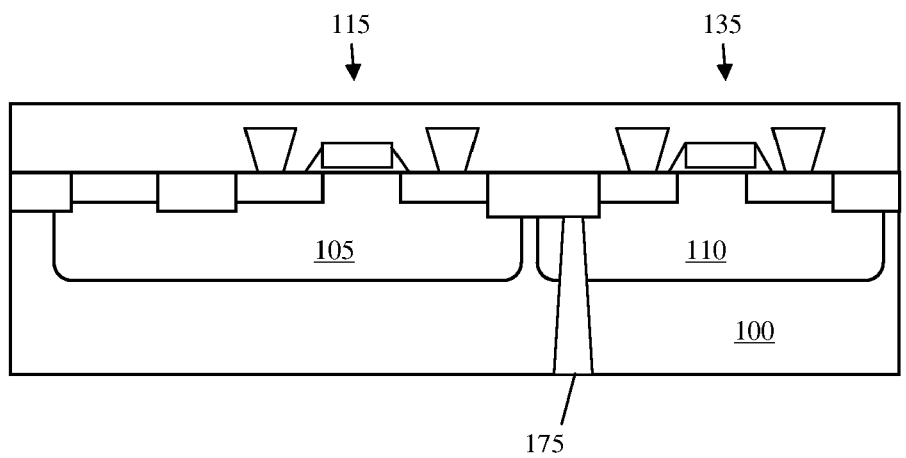

FIGS. 9 and 10 show configurations of an integrated circuit according to aspects of the invention in which the P-well 110 and the N-well 105 are not adjacent to one another (as in FIG. 5). As shown in FIG. 9, a space may be left between the P-well 110 and the N-well 105, and the TWV 175 may be formed adjacent to the P-well 110 and extending into the space (but not touching the N-well 105). Alternatively, as depicted in FIG. 10, the TWV 175 may be formed wholly within the confines of the P-well 110, with a space still formed between the P-well 110 and the N-well 105.

FIGS. 11-16 show configurations of the integrated circuit according to aspects of the invention in which in which a second TWV 175' is utilized. The second TWV 175', formed on a side of the P-well opposite the first TWV 175, provides additional protection against CMOS latchup. In embodiments, the second TWV 175', like the first TWV 175, extends from the back side of the substrate 100 to a bottom surface of an STI 175. With the usage of a plurality of through wafer via (TWV) structures, the substrate resistance is lower. Adding two TWV near a NFET lowers the substrate shunt resistance, providing a latchup improvement. Secondly, with the addition of more than one TWV, minority carriers from the NFET can not reach adjacent n-well regions in other adjacent circuitry. Providing a TWV on both side prevents the formation of a parasitic NPN element improving the latchup robustness in that physical dimension. Note that a TWV can be formed in all directions, avoiding parasitic NPN transistors with any n-type region in any other direction.

Figure 11:
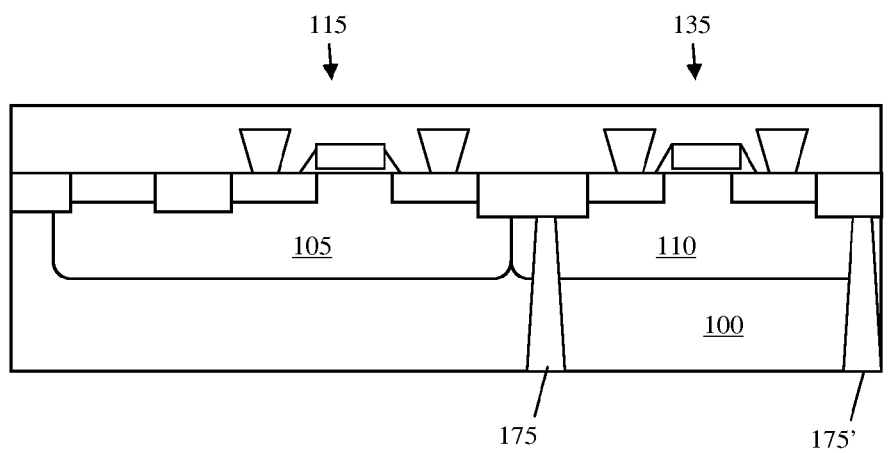
Figure 12:
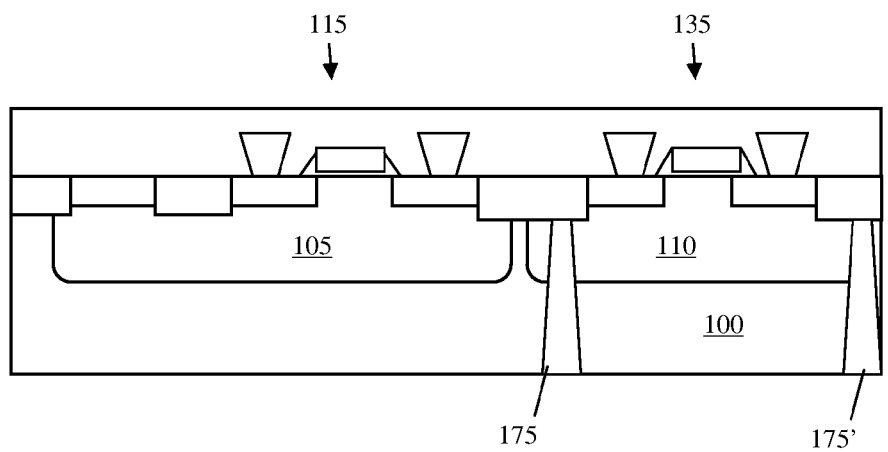
Figure 13:
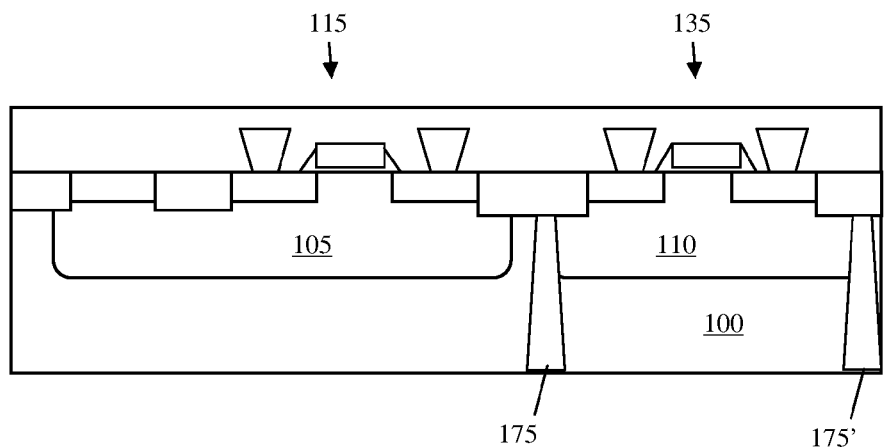
Figure 14:
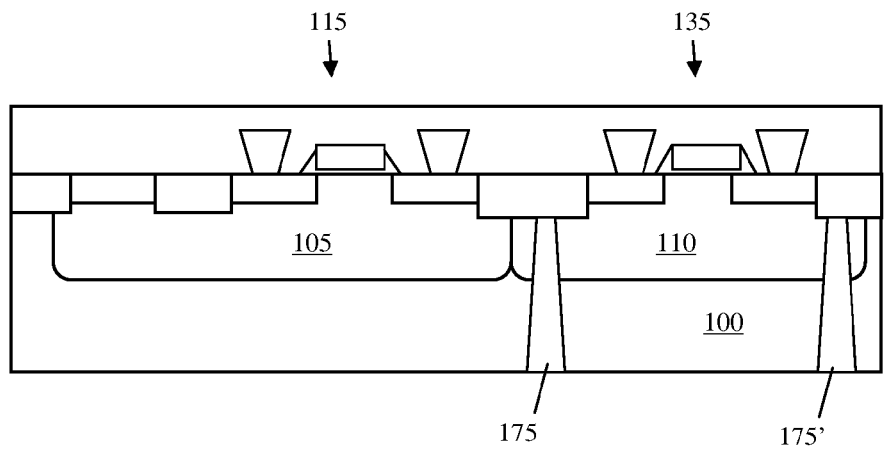
Figure 15:
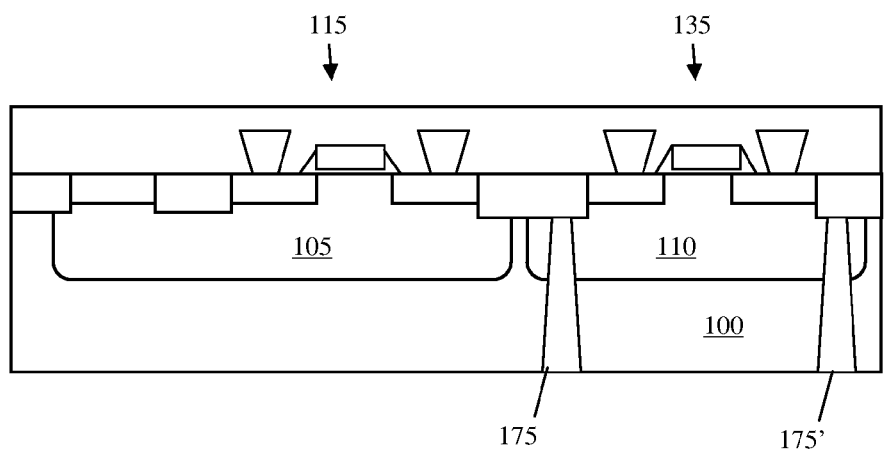
Figure 16:
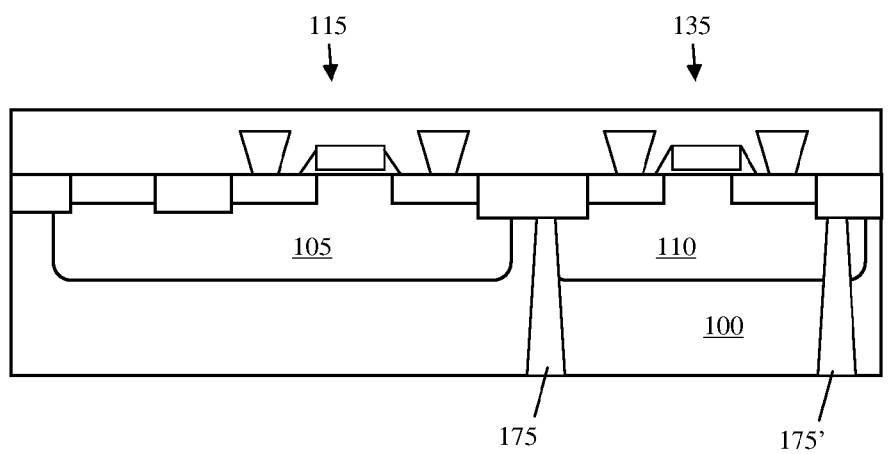

The arrangement of FIG. 11 shows the P-well 110 and the N-well 105 in contact with each other, the first TWV 175 within the P-well 110, and the second TWV 175' adjacent to the P-well 110. The arrangement of FIG. 12 shows the P-well 110 and the N-well 105 not in contact with each other, the first TWV 175 within the P-well 110, and the second TWV 175' adjacent to the P-well 110. The arrangement of FIG. 13 shows the P-well 110 and the N-well 105 not in contact with each other, the first TWV 175 adjacent the P-well 110, and the second TWV 175' adjacent to the P-well 110. The arrangement of FIG. 14 shows the P-well 110 and the N-well 105 in contact with each other, the first TWV 175 within the P-well 110, and the second TWV 175' within the P-well 110. The arrangement of FIG. 15 shows the P-well 110 and the N-well 105 not in contact with each other, the first TWV 175 within the P-well 110, and the second TWV 175' within the P-well 110. The arrangement of FIG. 16 shows the P-well 110 and the N-well 105 not in contact with each other, the first TWV 175 adjacent to the P-well 110, and the second TWV 175' within the P-well 110.

Figure 17:
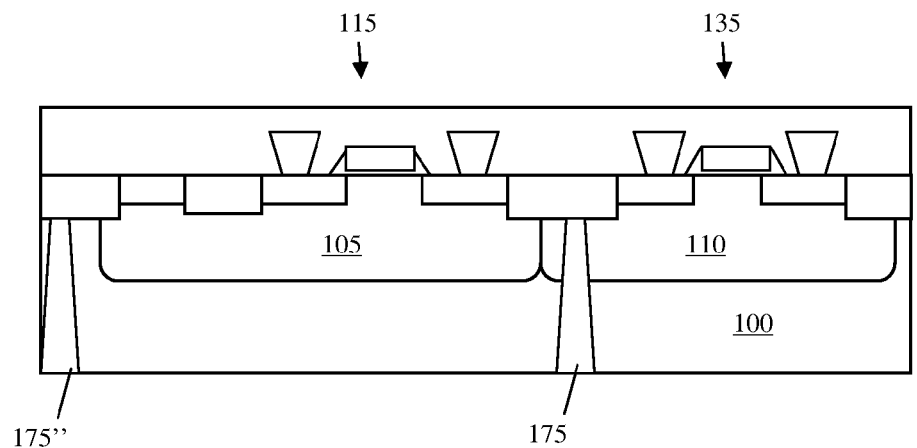
Figure 18:
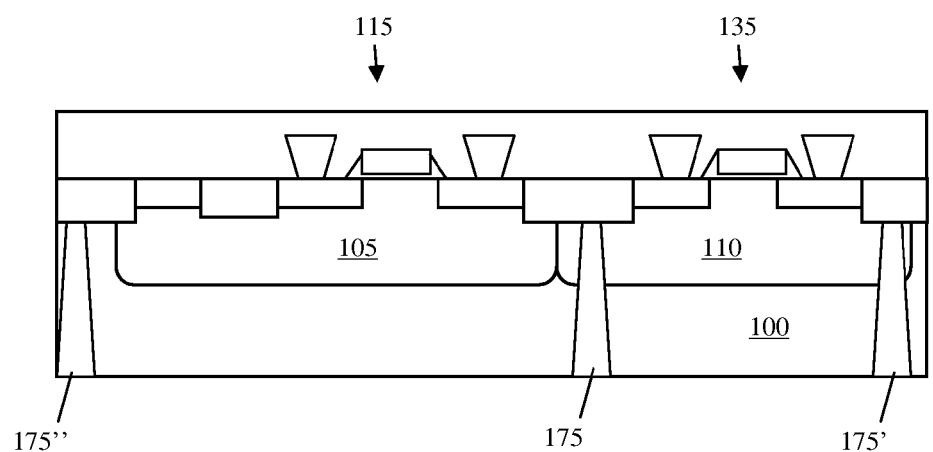
Figure 19:
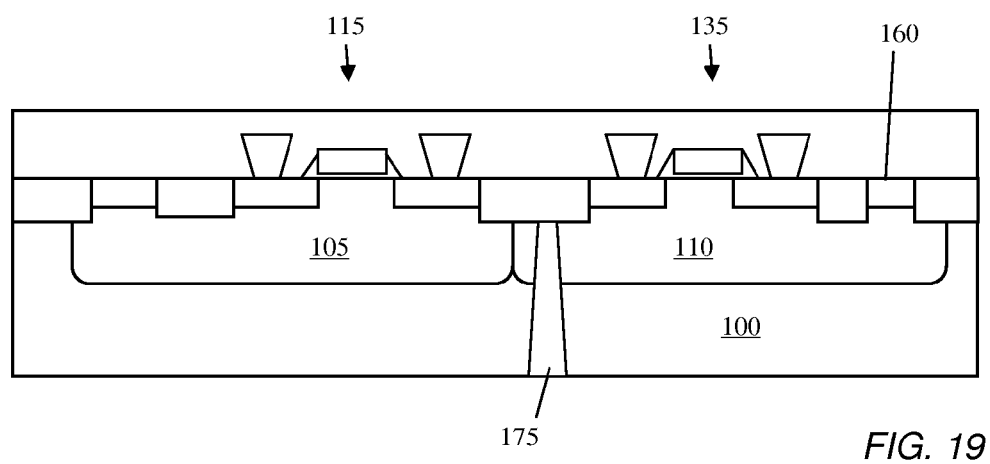

FIG. 17 shows an arrangement according to aspects of the invention in which a remote TWV 175" is formed on the opposite side of the N-well 105 (but not in contact with the N-well 105). In this fashion, minority carrier electrons can not reach the N-well region 105, preventing latchup from occurring due to injection from adjacent circuitry. FIG. 18 shows an arrangement according to aspects of the invention including a first TWV 175, second TWV 175', and remote TWV 175". FIG. 19 shows an arrangement according to aspects of the invention in which a TWV 175 is used in conjunction with a substrate contact 160 formed at the upper surface of the substrate.

FIGS. 9-19 demonstrate that one or more through wafer vias may be used in various locations of an integrated circuit to provide improved CMOS latchup performance. Moreover, although FIGS. 9-19 depict alternative arrangements of single gate CMOS devices, it should be understood that aspects of FIGS. 9-19 may be utilized with integrated circuits having gate arrays (e.g., similar to FIGS. 7 and 8).

FIGS. 5-19 depict structures in which the TWV (e.g., 175) extends from the backside of the wafer to a surface of the shallow trench isolation (STI) structure (e.g., 155). The STI defines the openings for MOSFETs, bipolar and other semiconductor components. Shallow trench isolation (STI) normally varies from about 0.1 um to about 0.5 um deep, and may be formed prior completion of the MOSFET and bipolar transistors.

However, the invention is not limited to use with STI structures. Instead, the TWV may also be used with trench isolation (TI) or deep trench (DT) structures. Trench isolation (TI) is a structure which often has less cost and is implemented later in the semiconductor process. As a result, the TI structure may be formed using an etch process after the MOSFET and bipolar transistors are formed in a BiCMOS process. In this case, the TI structure may be filled with oxide insulator due to low thermal cycles after this process step. For example, a silicon-dioxide TI is between about 2 um to about 4 um deep, and is formed prior to the back-end-of-line (BEOL) contact etch.

Figure 20:
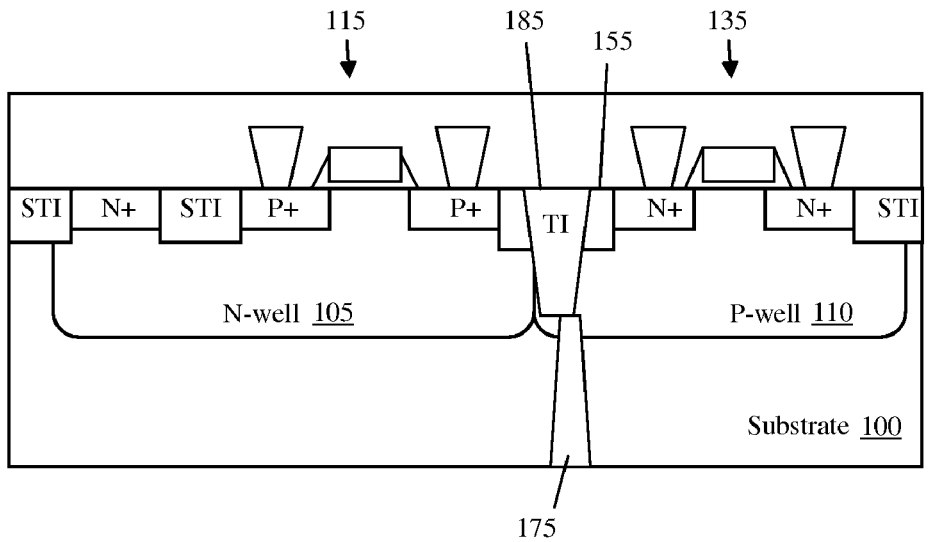
Figure 21:
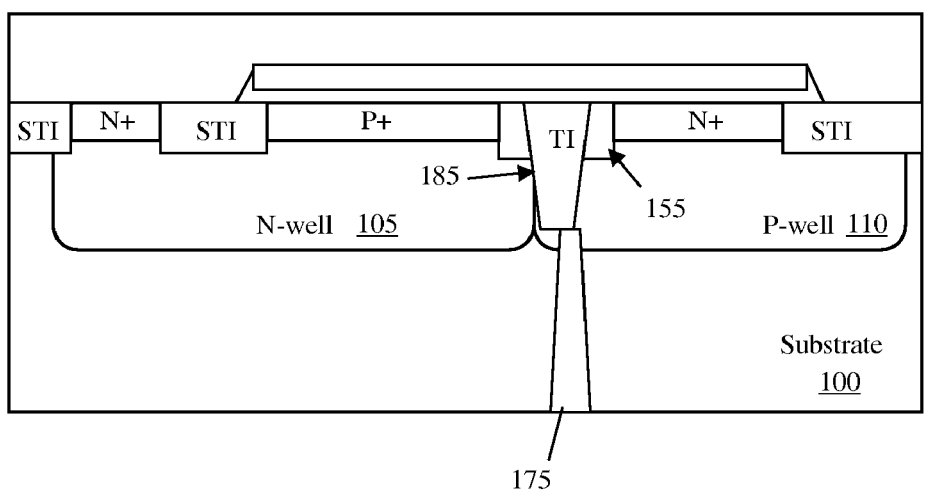

FIG. 20 shows a cross section of an integrated circuit according to aspects of the invention in which a TWV 175 is used in conjunction with a trench isolation (TI) structure 185. In embodiments, the TI 185 extends through an STI 155 located between the NFET 135 and the PFET 115. The TWV 175 extends from the back side of the substrate 100 to the bottom surface of the TI 185. As with the embodiments described supra, the TWV 175 contacts the P-well 110 but not the N-well 105, thereby creating an electrical connection with the P-well 110. As depicted in FIG. 21, the TI 185 and TWV 175 may also be used in an integrated circuit having a gate array. Although not shown, various arrangements and locations of the TI 185 and TWV 175 (e.g., similar to that shown in FIGS. 9-19) may also be used in implementations of the invention. The TI 185 may be used to provide enhanced CMOS latchup performance, as it extends even further below the region where PNPN parasitic contact begins (e.g., when compared to embodiments using only STI structures). The presence of the TI structure 185 prevents electrons to flow from the n+ diffusions of the NFET 135 to the N-well 105, preventing the formation of a parasitic npn transistor. In conjunction with the TWV abutting the TI region, electrons that flow deep into the substrate below the p-well region 110 can not reach the N-well region 105. Hence the arrangement of the TI and TWV together prevent the formation of a parasitic npn transistor; hence, preventing formation of a parasitic pnpn and hence, CMOS latchup.

A deep trench (DT) structure may include a structure formed early in the semiconductor process. The DT structure typically has an oxide sidewall, and may be filled with polysilicon material (e.g., to avoid thermal stress issues). In this example, the structure can be referred to as the polysilicon-filled DT structure. The depth of the DT structure may range from about 4 um to about 12 um, for example. The DT structure also can be formed after epitaxial growth in a BiCMOS process.

Figure 22:
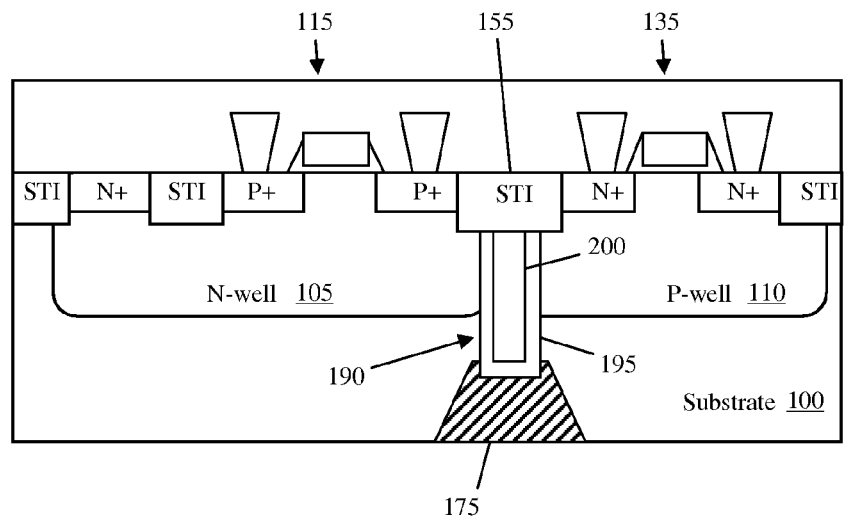

FIG. 22 shows a cross section of an integrated circuit according to aspects of the invention in which a deep trench (DT) structure 190 is utilized in conjunction with a TWV 175. In embodiments, the DT 190 comprises a sidewall 195 and a core 200, such as, for example, an oxide and/or nitride sidewall 195 and a polysilicon or refractory metal core 200. In embodiments, the TWV 175 extends from the backside of the wafer to the bottom of the DT 190, which is located below the lower surface of the P-well 110. According to further aspects of the invention, the DT 190 extends from the TWV 175 to a bottom surface of an STI 155 between the NFET 135 and the PFET 115. The DT 190 may be used to provide enhanced CMOS latchup performance, as it extends even further below the region where PNPN parasitic contact begins (e.g., when compared to embodiments using only STI structures or STI and TI structures). The presence of the DT structure 190 prevents electrons to flow from the n+ diffusions of the NFET 135 to the N-well 105, preventing the formation of a parasitic npn transistor. In conjunction with the TWV abutting the DT region, electrons that flow deep into the substrate below the p-well region 110 can not reach the N-well region 105. Hence the arrangement of the DT and TWV together prevent the formation of a parasitic npn transistor; hence, preventing formation of a parasitic pnpn and hence, CMOS latchup.

Figure 23:
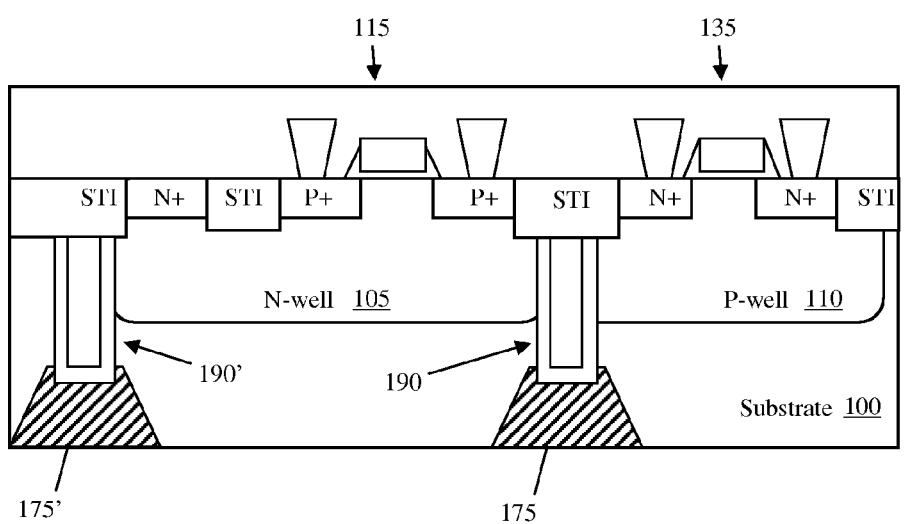
Figure 24:
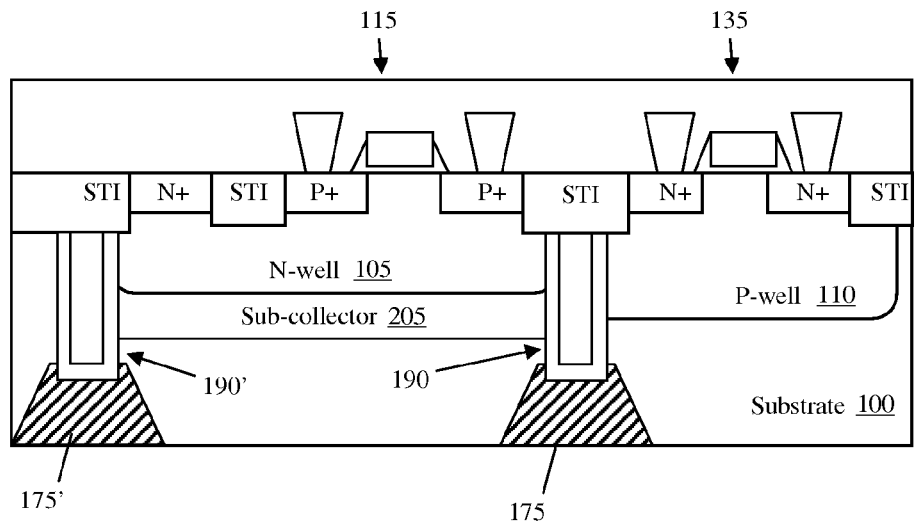
Figure 25:
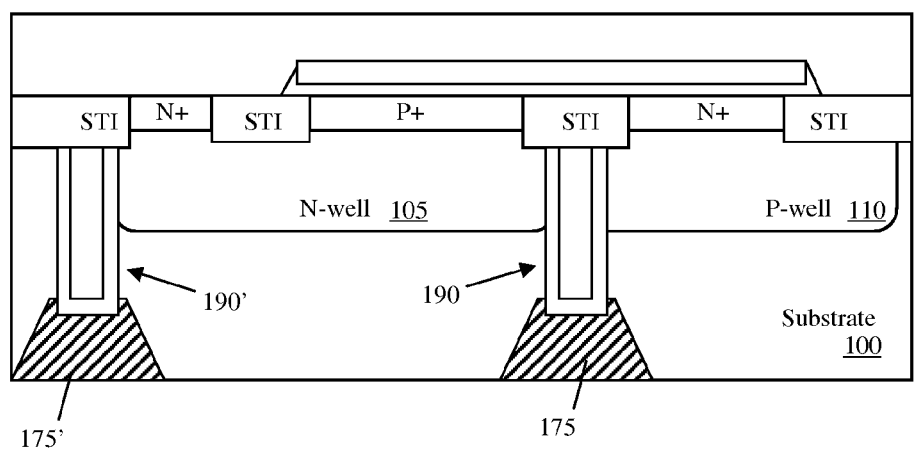

FIG. 23 shows a configuration according to aspects of the invention having an NFET 135 and a PFET 115, in which a second TWV 175' and second DT 190' are formed on a side of the N-well opposite the first TWV 175 and first DT 190. FIG. 24 shows an arrangement according to aspects of the invention having an NFET 135 and a PFET 115 in which a subcollector 205 is formed under the N-well 105 between the first DT 190 and the second DT 190'. The subcollector 205 is an N-type region formed using a different implantation dosage and energy than the N-well 105, and thus forms an additional barrier to the development of a parasitic PNPN circuit. As depicted in FIG. 25, the combination of a TWV 175 and DT 190 can also be used with integrated circuits comprising gate arrays. Moreover, although not shown, various arrangements and locations of the DT 190 and TWV 175 (e.g., similar to that shown in FIGS. 9-19) may also be used in implementations of the invention.

In embodiments described up to this point, the TWV acts as a substrate contact that is at substantially the same electrical potential as the P-well. Also, the TWV serves as a low resistance shunt to the substrate which lowers the possibility of CMOS latchup by preventing forward bias of the junction (e.g., prevents an emitter base voltage (VBE) of the parasitic NPN). Since it is undesirable to short the N-well and P-well together in such configurations, the TWV only contacts the P-well, and not the N-well.

However, use of a TWV is not limited to the situations already described herein. For example, in high voltage power applications having a deep N-well, a TWV may be used as a low resistance shunt to minimize CMOS latchup by lowering the N-well shunt resistance. In embodiments, dopants deposited in the TWV trench are out-diffused to form a high voltage junction isolation of the TWV to the substrate region while making an electrical connection to the deep N-well and/or the PFET N-well above the deep N-well.

Figure 26:
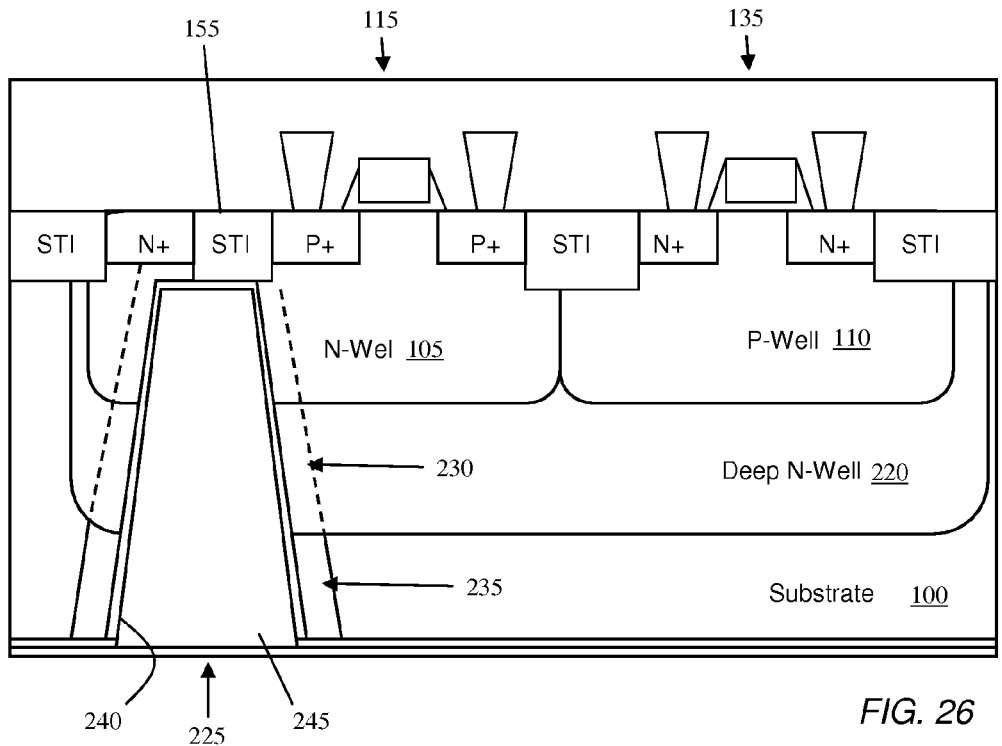

For example, FIG. 26 shows a cross section of an integrated circuit having a substrate 100, N-well 105, P-well 110, PFET 115, NFET 135 and STI 155. The circuit further comprises a deep N-well 220, formed below the N-well 105 and P-well 110. Such configurations are commonly utilized, for example, in high voltage power applications. However, instead of having a through wafer via in contact with the P-well (e.g., TWV 175), the circuit shown in FIG. 26 has a deep well through wafer via 225 extending from the bottom of an STI 155, through the N-well 105, through the deep N-well 220, and through the substrate 100 to a back end of the wafer. As described in greater detail herein, an out diffusion of dopants creates an electrical connection region 230 between the deep well through wafer via 225 and at least one of the N-well 105 and the deep N-well 220. The same out-diffusion also creates a high voltage junction 235 at the interface between the deep well through wafer via 225 and the substrate 100. In this manner, the deep well through wafer via 225 may be used as a low resistance shunt to minimize CMOS latchup by lowering the shunt resistance of the N-well 105.

In embodiments, the deep well through wafer via 225 includes a barrier metal liner 240 and a conductor 245. The barrier metal liner 240 may comprise, but is not limited to: titanium nitride or other refractory metal nitride, titanium or other refractory metal, titanium silicide or other metal silicide, or combination thereof. The conductor 245 may include, but is not limited to: doped polysilicon, tungsten, titanium, tantalum, aluminum, copper, platinum, nickel, cobalt, metal silicide or combinations thereof.

Figure 27:
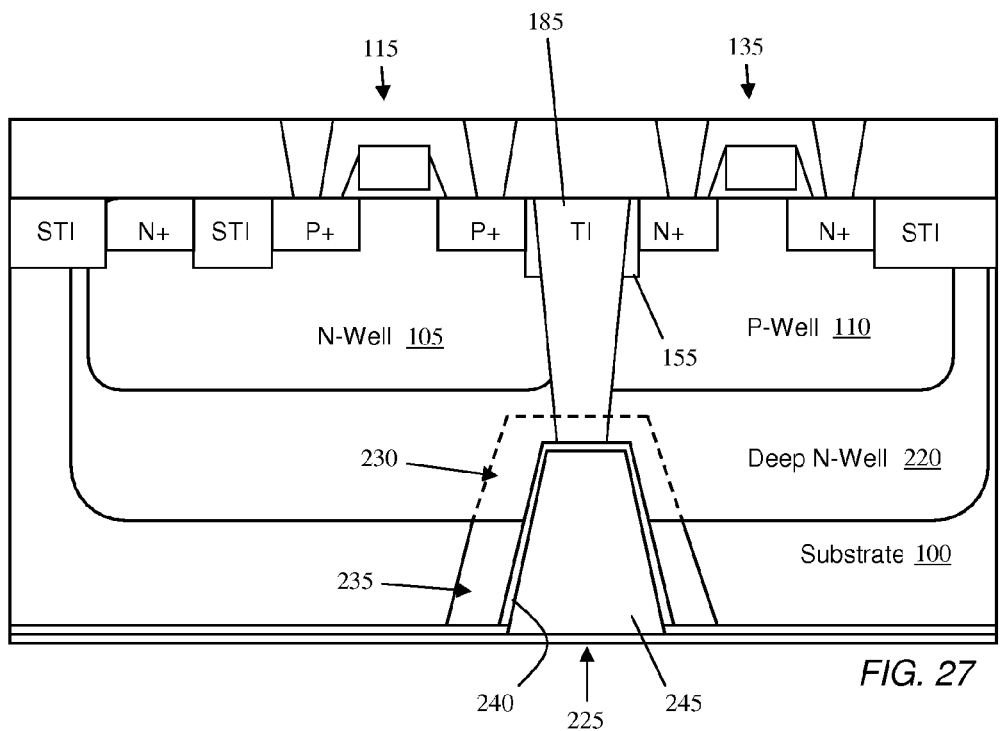

FIG. 27 shows a deep N-well device having a deep well through wafer via in association with a trench isolation (TI) structure 185. More specifically, FIG. 27 shows a circuit having a substrate 100, N-well 105, P-well 110, PFET 115, NFET 135 and STI 155. The circuit further comprises a deep N-well 220, formed below the N-well 105 and P-well 110. A trench isolation (TI) 185 extends through one of the STI 155, down into the deep N-well 220. A deep well through wafer via 225 extends from the back side of the wafer to the bottom of the TI 185. Due to an out-diffusion process, the circuit includes an electrical connection region 230 between the deep well through wafer via 225 and the deep N-well 220, and a high voltage junction region 235 between the deep well through wafer via 225 and the substrate 100. In embodiments, the deep well through wafer via 225 includes a barrier metal liner 240 and a conductor 245.

Figure 28:
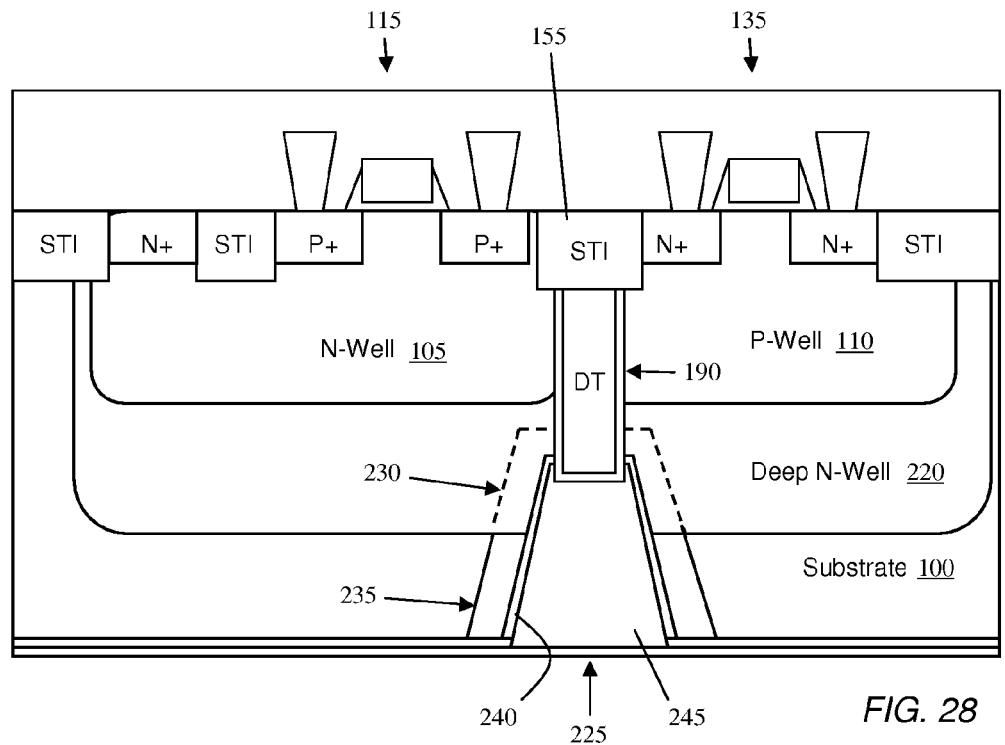

FIG. 28 shows a deep N-well device having a deep well through wafer via in association with a deep trench (DT) structure 190. More specifically, FIG. 28 shows a circuit having a substrate 100, N-well 105, P-well 110, PFET 115, NFET 135 and STI 155. The circuit further comprises a deep N-well 220, formed below the N-well 105 and P-well 110. A deep trench (DT) 190 extends from the bottom surface of one of the STI 155, down into the deep N-well 220. A deep well through wafer via 225 extends from the back side of the wafer to the bottom of the DT 190. Due to an out-diffusion process, the structure includes an electrical connection region 230 between the deep well through wafer via 225 and the deep N-well 220, and a high voltage junction region 235 between the deep well through wafer via 225 and the substrate 100. In embodiments, the deep well through wafer via 225 includes a barrier metal liner 240 and a conductor 245. In embodiments, the DT 190 includes a sidewall 195 and a core 200 (e.g., similar to that of FIG. 22).

Figure 29:
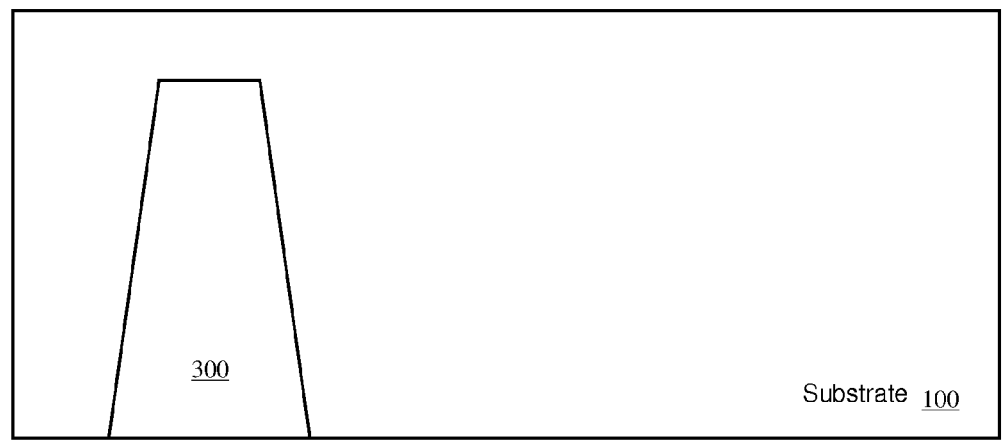
FIGS. 29-54 show intermediate structures and process steps in accordance with aspects of the invention.

FIGS. 29-37 show intermediate structures and respective processing steps for manufacturing a semiconductor structure having a deep N-well, and a deep well through wafer via in contact with a shallow trench isolation (STI), in accordance with aspects of the invention. Specifically, FIG. 29 shows cross section of an exemplary semiconductor structure in which a trench 300 for a through wafer via is formed in a substrate 100. The trench 300 may be formed using conventional techniques, such as, for example, forming a resist pattern (not shown) on the back side of the substrate 100, etching material to form the trench 300, and removing the resist.

Figure 30:
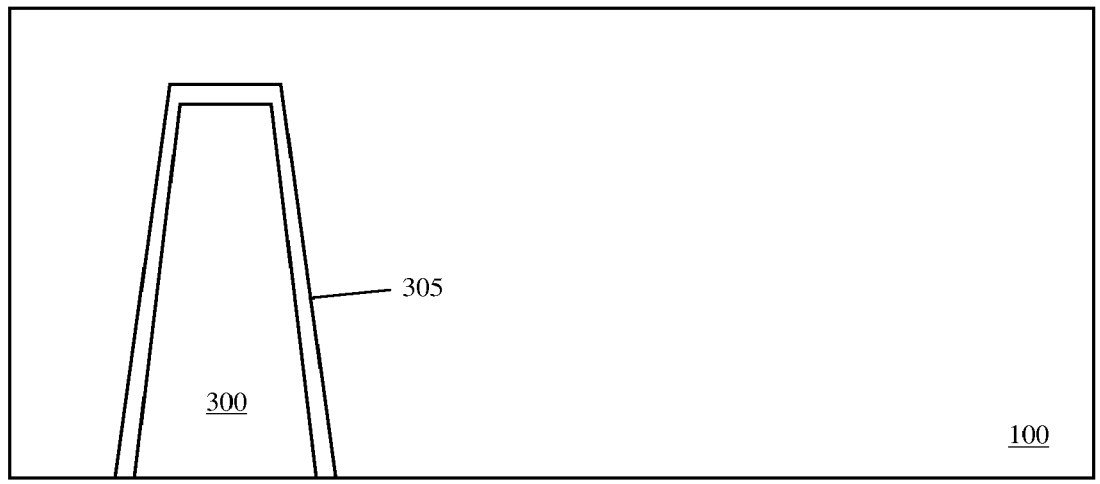

At FIG. 30, a dopant source 305 is deposited on the surfaces of the trench 300. The dopant source 305 may be deposited using conventional techniques, such as, for example, chemical vapor deposition (CVD), plasma assisted CVD, etc. In embodiments, the dopant source 305 comprises doped polysilicon, doped oxides or doped silicate glasses, although the invention is not limited to these examples, and any suitable compositions may be used.

Figure 31:
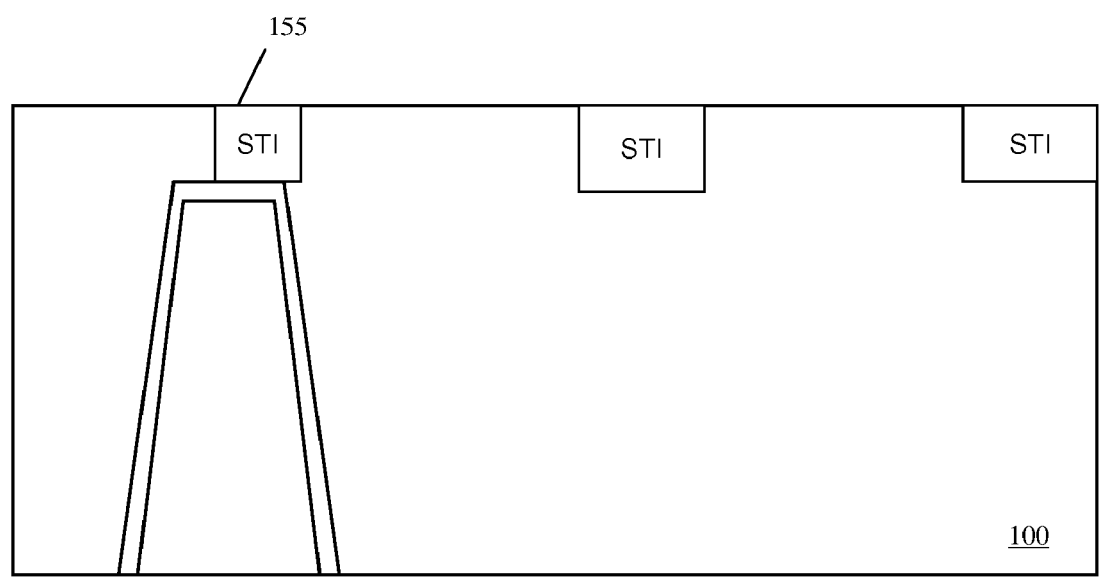

At FIG. 31, shallow trench isolations (STI) 155 are formed on the top side of the substrate 100. The STI 155 may be formed using conventional techniques, such as, for example: depositing resist on the upper surface of the substrate; masking and patterning the resist to form openings for the STI; etching substrate material in the openings; stripping the resist and cleaning the upper surface of the substrate; depositing STI material (e.g., oxide and/or nitride); and planarizing the top surface of the substrate.

Figure 32:
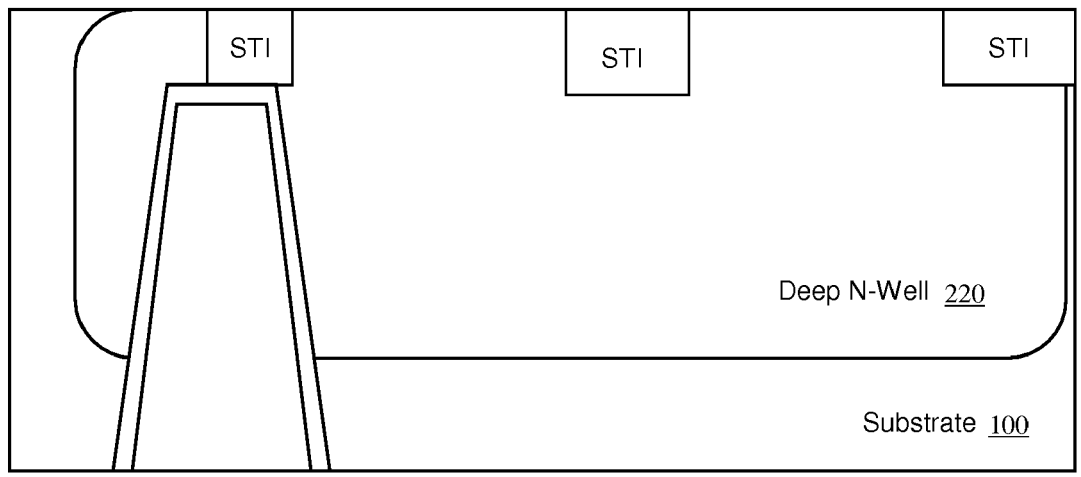

At FIG. 32, a deep diffused N-well 220 is formed in the substrate 100. The deep N-well 220 may be formed using conventional techniques, such as, for example, forming a resist pattern on the top surface of the substrate, implanting a suitable dopant to form the deep N-well, and removing the resist.

Figure 33:
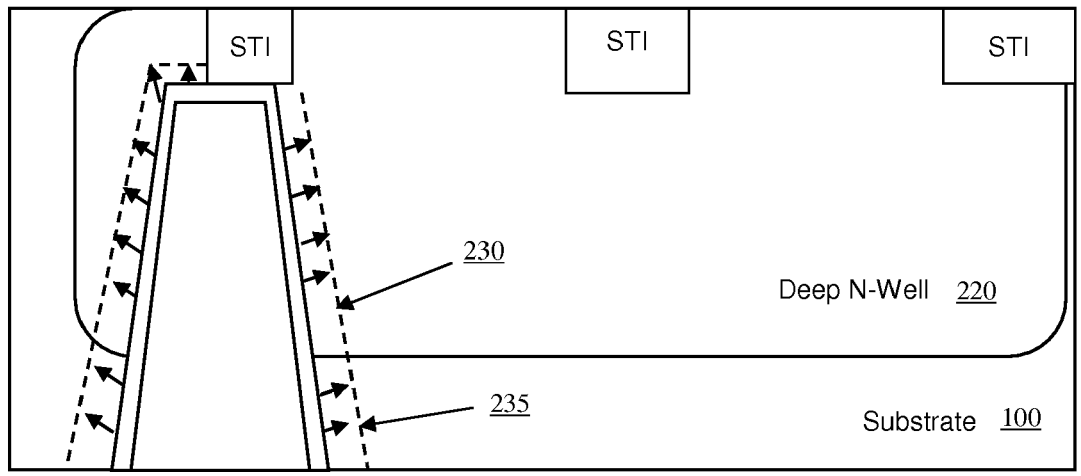

At FIG. 33, a hot process out-diffusion step is performed. The out-diffusion causes dopant from the dopant source to diffuse outward into the substrate 100 and deep N-well 220, as depicted by the arrows and dotted line in FIG. 33. The out-diffusion creates a high-voltage junction region 235 between the through wafer via opening 300 and the substrate 100. The out-diffusion also creates an electrical contact region 230 between the through wafer via opening 300 and the deep N-well 220. In embodiments, the hot process out-diffusion step comprises the use of thermal anneals whereby dopants diffuse from areas of higher concentration, to areas of lower concentration.

Figure 34:
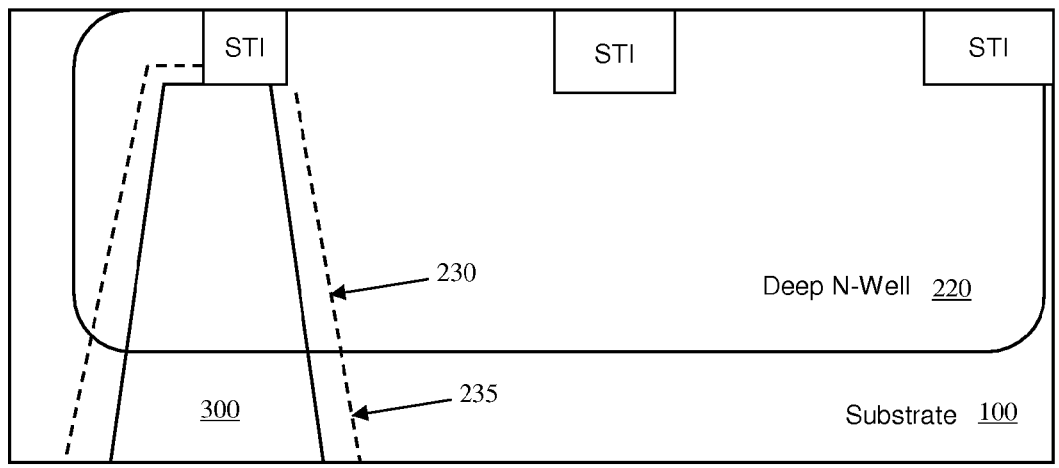

Optionally, as shown in FIG. 34, any remaining dopant source (e.g., backside dopant) is removed from the through wafer via opening 300. The remaining dopant source may be removed using conventional stripping techniques. In embodiments, this step is optional, and generally is not required when doped silicon or ion-implanted materials are used as the dopant source.

Figure 35:
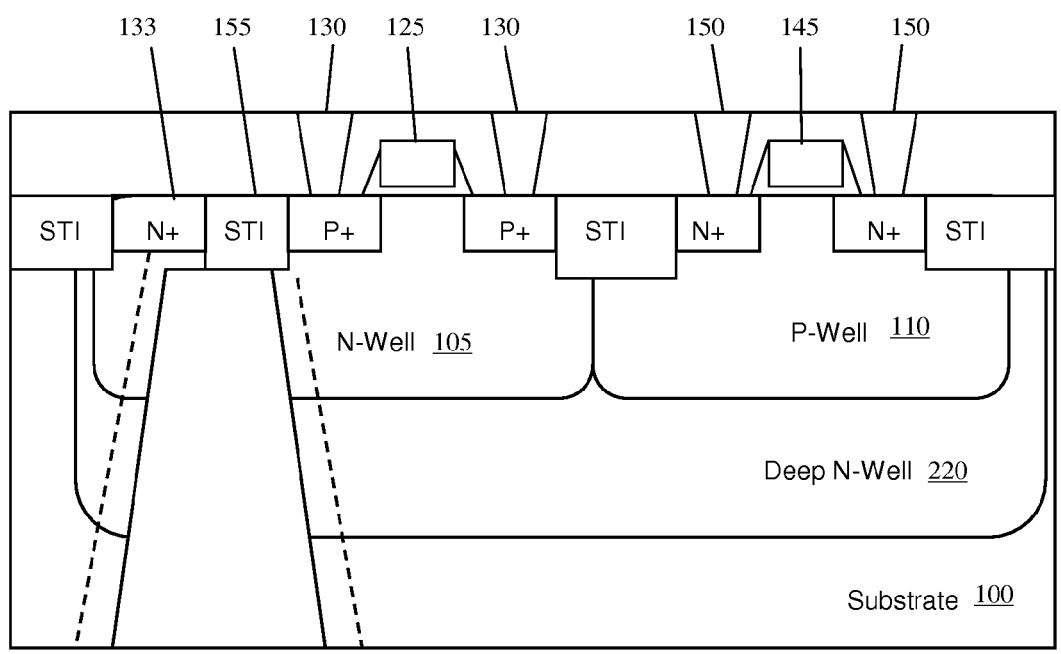

After the out-diffusion and optional removal of remaining dopant source, standard processing continues on the top side of the chip. For example, as depicted in FIG. 35, the following features may be formed using conventional methods: N-well 105; P-well 110; PFET source/drain; PFET gate 125; PFET source/drain contacts 130; NFET source/drain; NFET gate 145; NFET source/drain contacts 150; and N-well contact 133.

Figure 36:
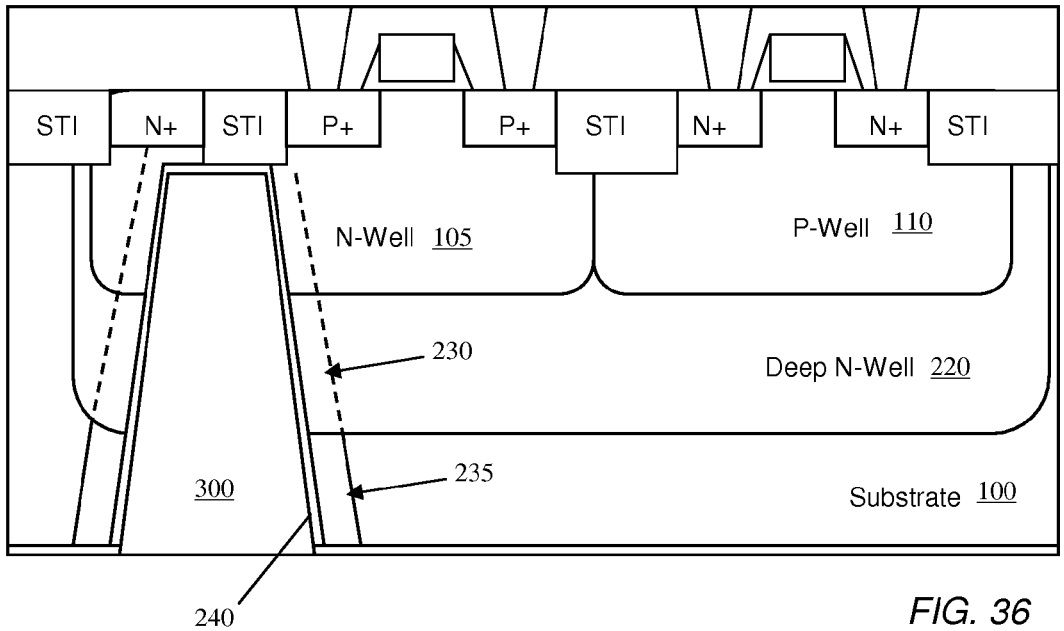
Figure 37:
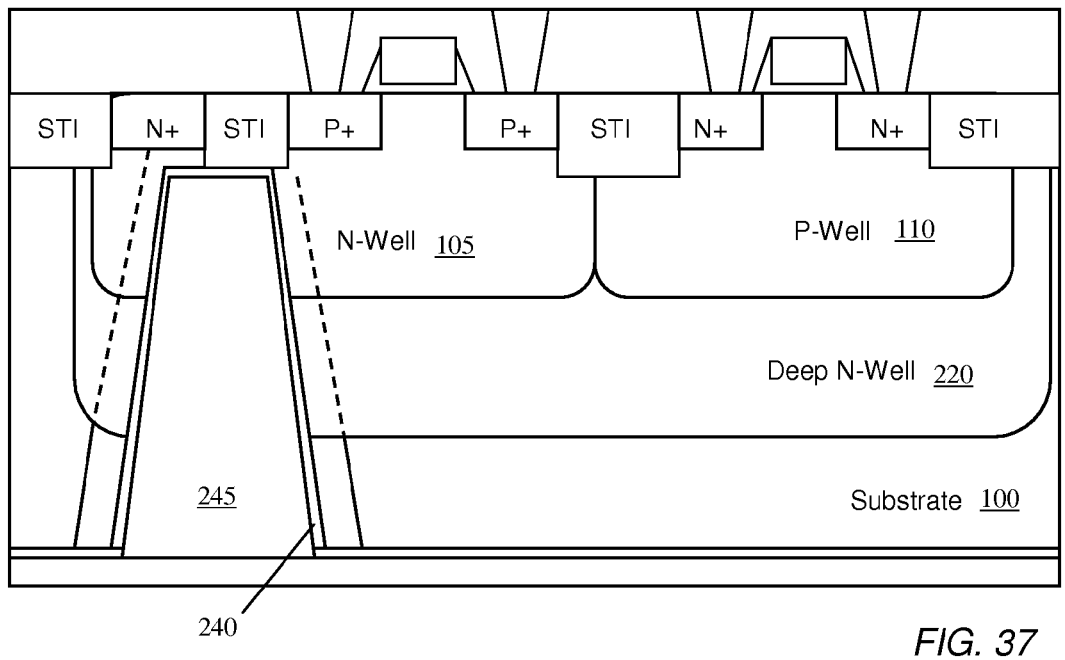

At FIG. 36, a barrier metal 240 is deposited in the through wafer via opening 300. The barrier metal 240 may comprise, for example, titanium nitride or other refractory metal nitride, titanium or other refractory metal, titanium silicide or other metal silicide, or combination thereof, and may be deposited using conventional techniques. At FIG. 37, the through wafer via opening 300 is filled with a conductor 245, thereby forming a deep well through wafer via (e.g., 225). At this point, the chip may be finished using, for example, conventional back end of line (BEOL) processing techniques.

Figure 38:
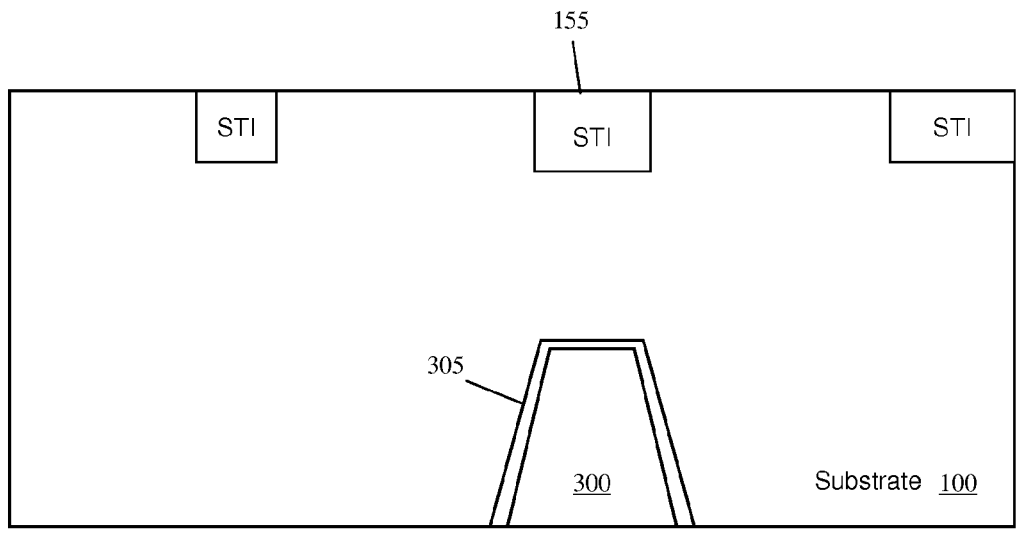

FIGS. 38-46 show intermediate structures and respective processing steps for manufacturing a semiconductor structure having a deep N-well, and a deep well through wafer via in contact with a trench isolation (TI) structure, in accordance with aspects of the invention. Specifically, FIG. 38 shows cross section of an exemplary semiconductor structure in which a through wafer via trench 300 is formed in a substrate 100. A dopant source 305 is formed on the walls of the through wafer via trench 300, and STI structures 155 are formed in the top side of the substrate 100. These features may be formed in a manner similar to that described with respect to FIGS. 29-31. Of note, however, is that in FIG. 38, the through wafer via trench 300 does not extend to the base of the STI 155.

Figure 39:
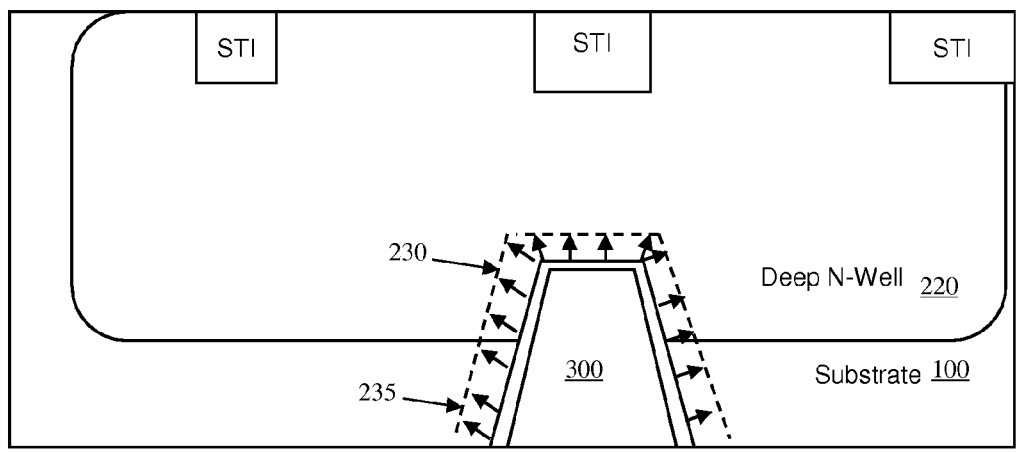
Figure 40:
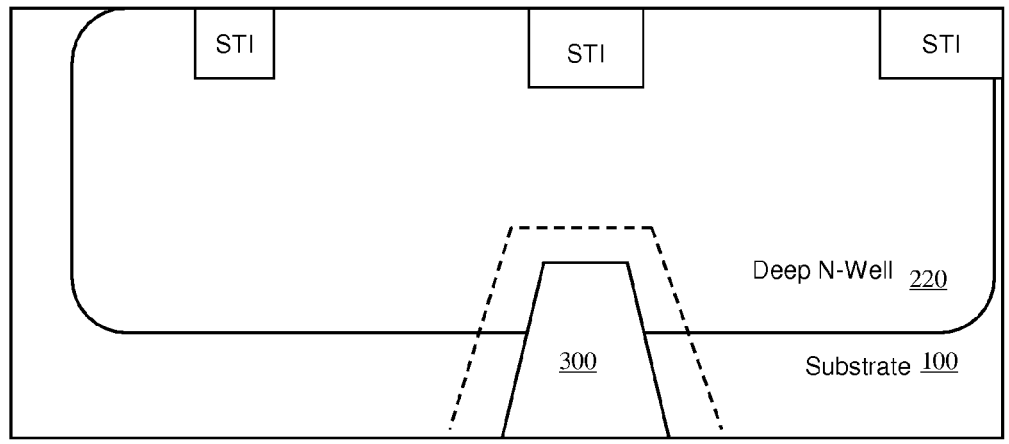
Figure 41:
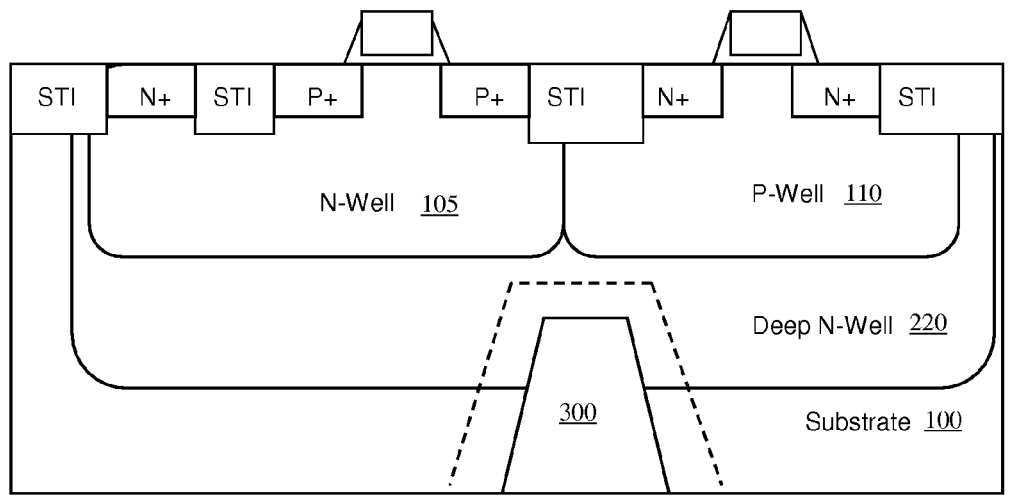
Figure 42:
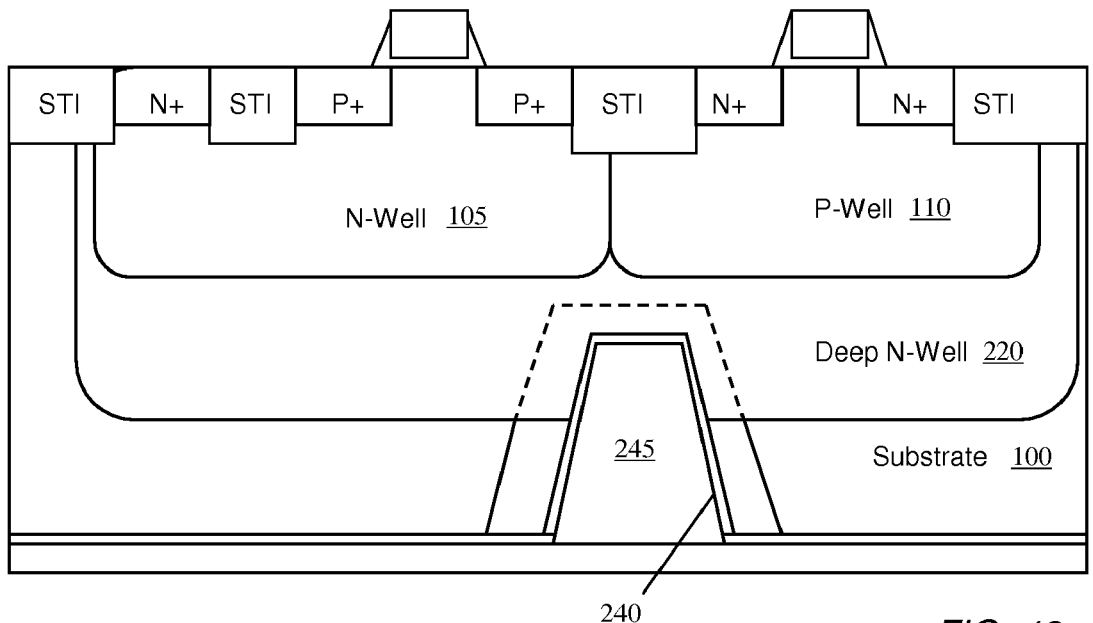

As depicted in FIG. 39, a deep N-well 220 is implanted in the substrate 100, and the dopant source is out-diffused, similar to FIGS. 32 and 33 described above. The out-diffusion creates a high-voltage junction region 235 between the through wafer via opening 300 and the substrate 100, and also an electrical contact region 230 between the through wafer via opening 300 and the deep N-well 220. At FIG. 40, any remaining dopant source may optionally be removed, similar to FIG. 34. At FIG. 41, standard processing of the top side of the chip may be performed, similar to FIG. 35, with the exception that the source/drain contacts are not yet formed. At FIG. 42, a barrier metal 240 and conductor 245 are deposited in the through wafer via trench 300, similar to FIGS. 36 and 37.

Figure 43:
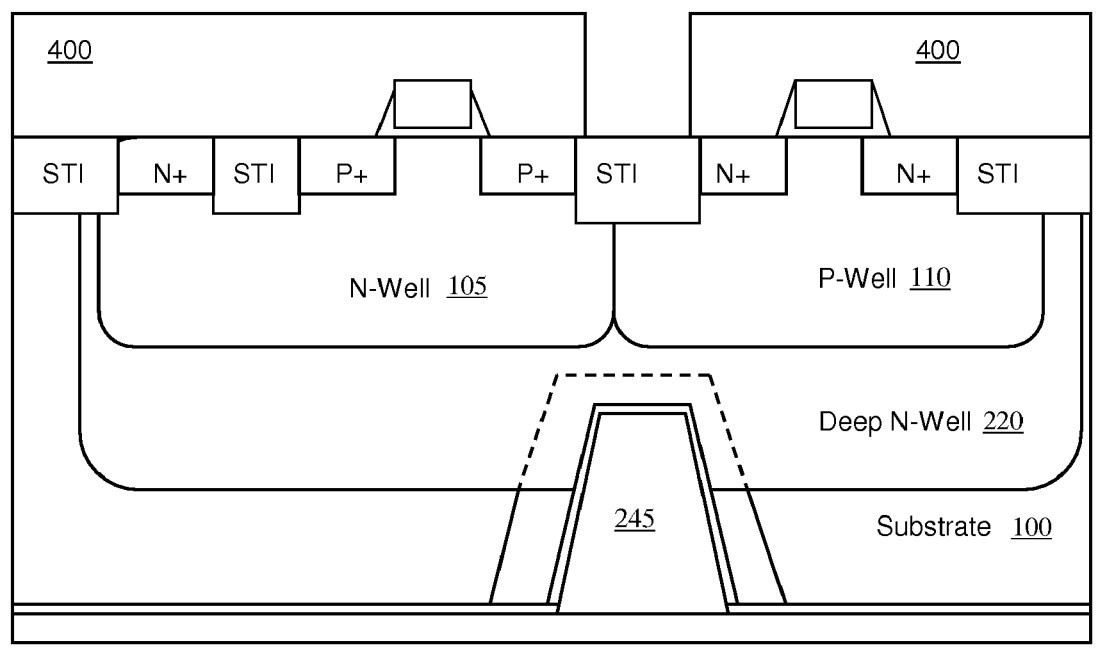
Figure 44:
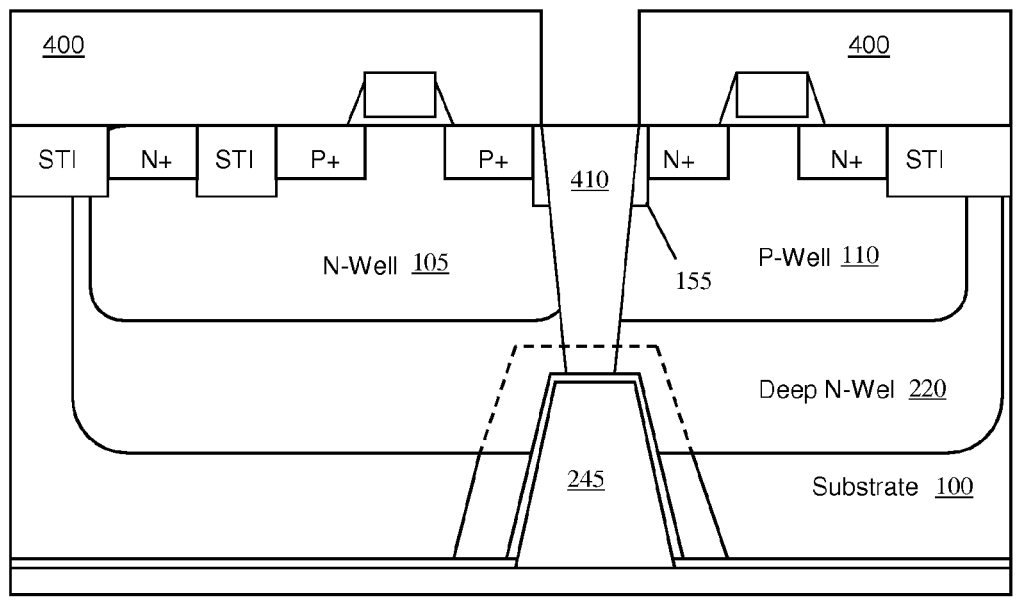
Figure 45:
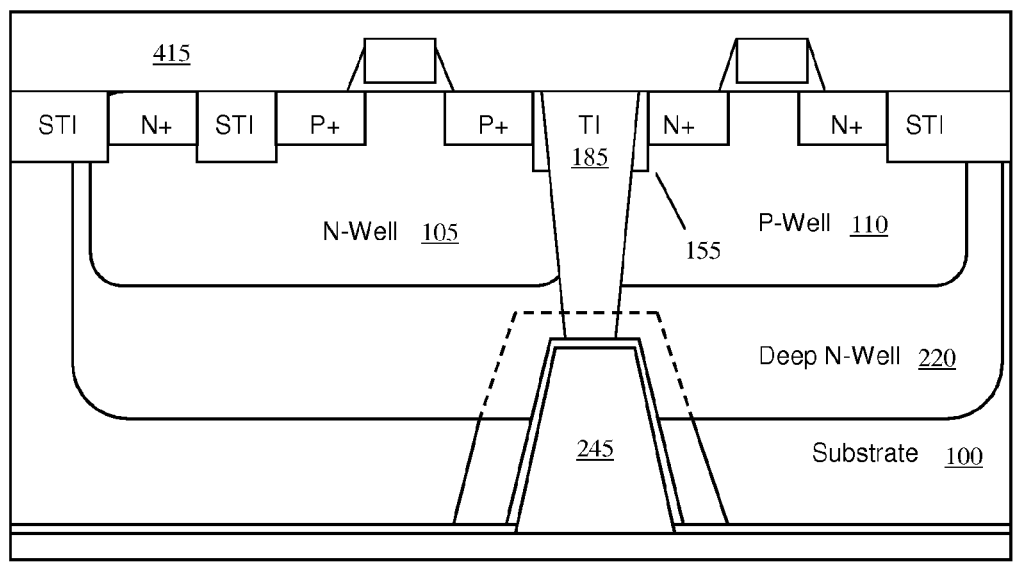
Figure 46:
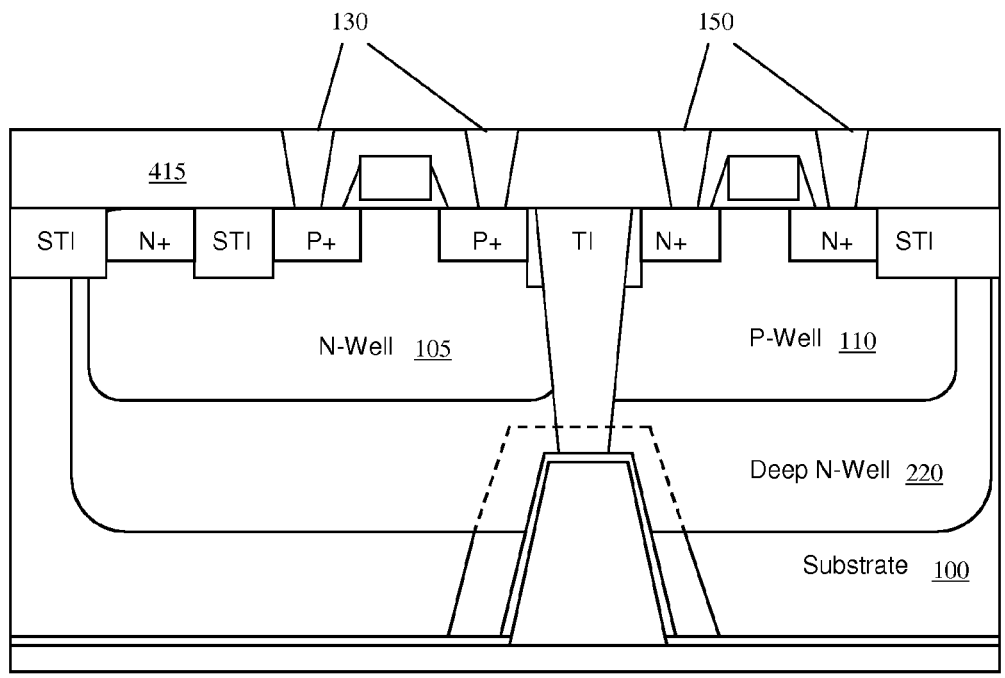

At FIG. 43, a resist layer 400 is patterned on the top side of the substrate, leaving open the region 405 where the trench isolation (TI) structure will be formed. At FIG. 44, a trench 410 for the trench isolation (TI) structure is etched through the STI 155, through the N-well 105 and P-well 110, through the deep N-well 220, down to the top surface of the barrier metal 240. Subsequently, as shown at FIG. 45, the resist is stripped, the upper side of the substrate is cleaned, and dielectric 415 is deposited on the upper side of the substrate filling the trench 410, thereby creating the TI 185. The dielectric 415 may be planarized. Then, as shown in FIG. 46, the source drain contacts 130 and 150 are formed in the dielectric 415. At this point, the chip may be finished using, for example, conventional back end of line (BEOL) processing techniques.

Figure 47:
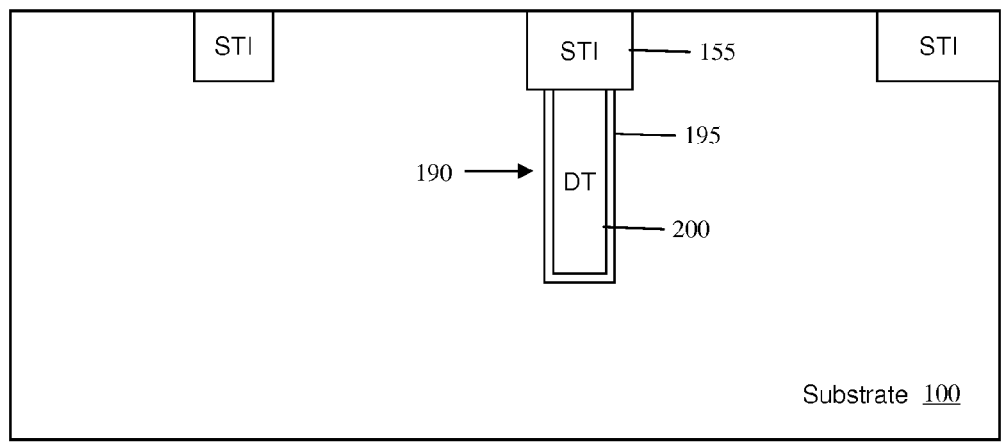

FIGS. 47-54 show intermediate structures and respective processing steps for manufacturing a semiconductor structure having a deep N-well, and a deep well through wafer via in contact with a deep trench (DT) structure, in accordance with aspects of the invention. Specifically, FIG. 47 shows cross section of an exemplary semiconductor structure in which shallow trench isolation (STI) structures 155 and a deep trench (DT) structure 190 are formed at the top side of a substrate 100. The DT 190 may include a sidewall 195 and a core 200 (e.g., as described above with respect to FIG. 22). The STI 155 and DT 190 may be formed using conventional techniques, such as, for example, masking, etching, deposition, etc.

Figure 48:
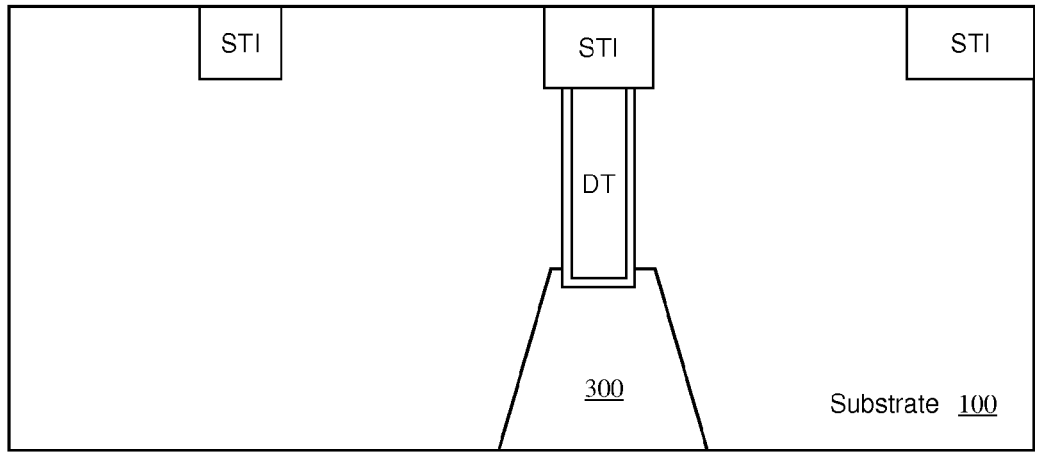
Figure 49:
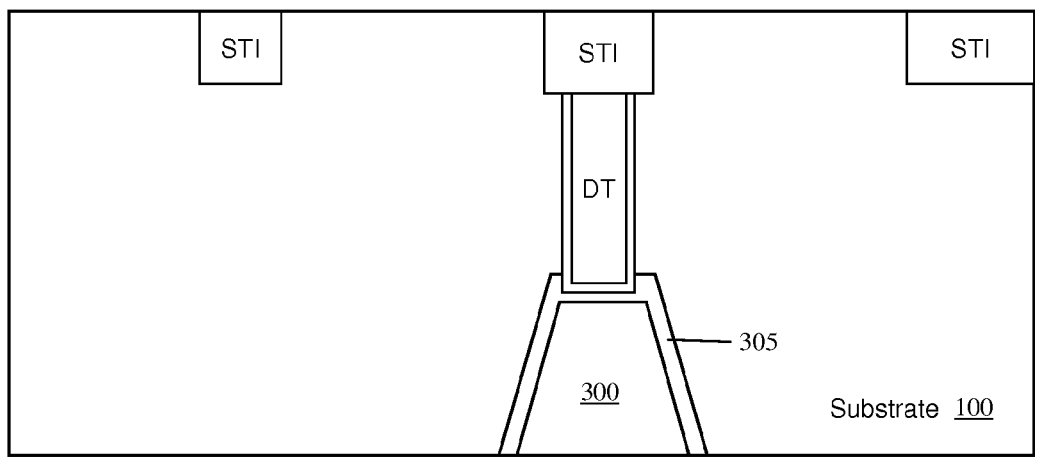

At FIG. 48, a through wafer via trench 300 is formed in the bottom surface of the substrate 100. Then, as shown at FIG. 49, a dopant source 305 is formed on the walls of the through wafer via trench 300. These features may be formed in a manner similar to that described with respect to FIGS. 29-31.

Figure 50:
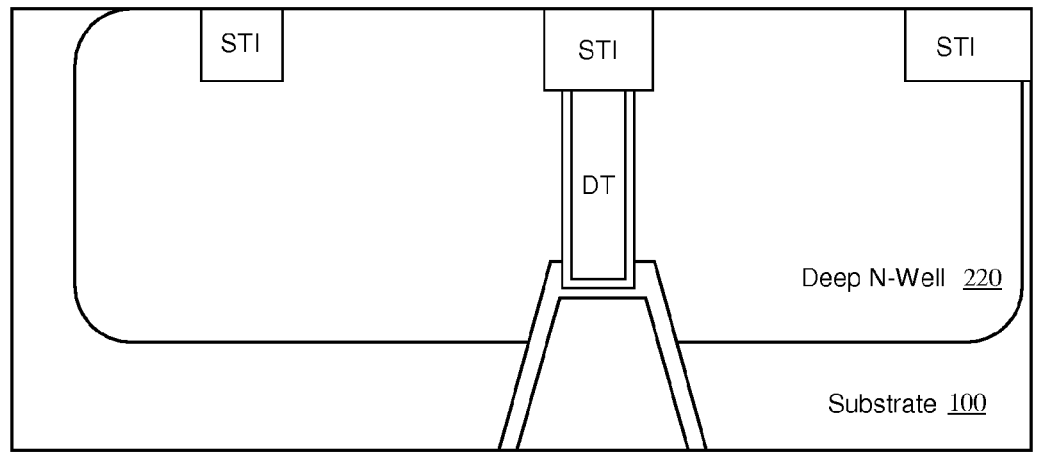
Figure 51:
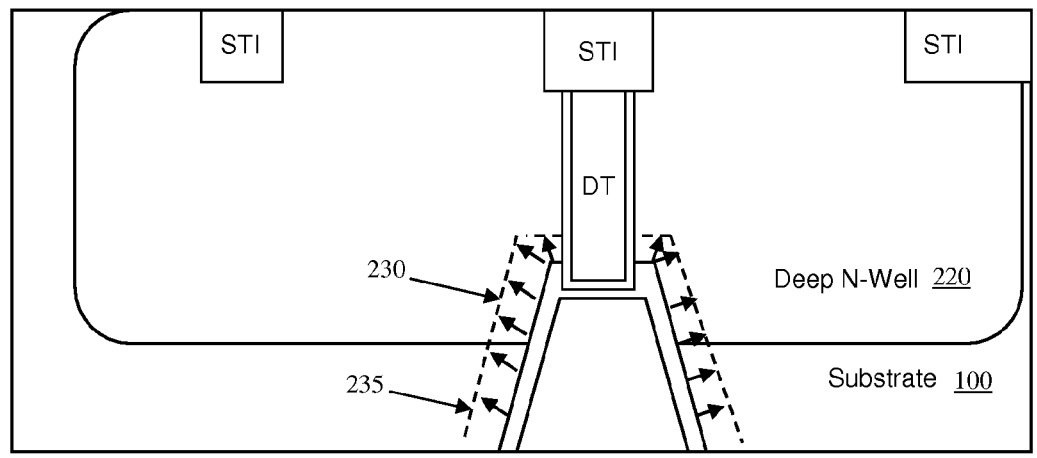
Figure 52:
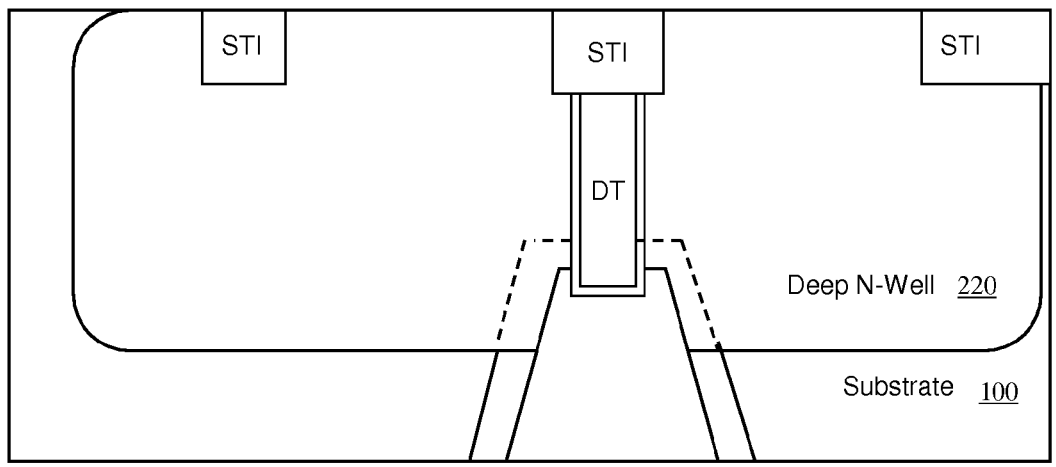

At FIG. 50, a deep N-well is formed in the substrate 100. At FIG. 51 an out-diffusion process is performed, creating an electrical connection region 230 and a high voltage junction 235. At FIG. 52, any remaining dopant source may optionally be removed. The steps of FIGS. 50-52 may be performed similar to those described with respect to FIGS. 32-34.

Figure 53:
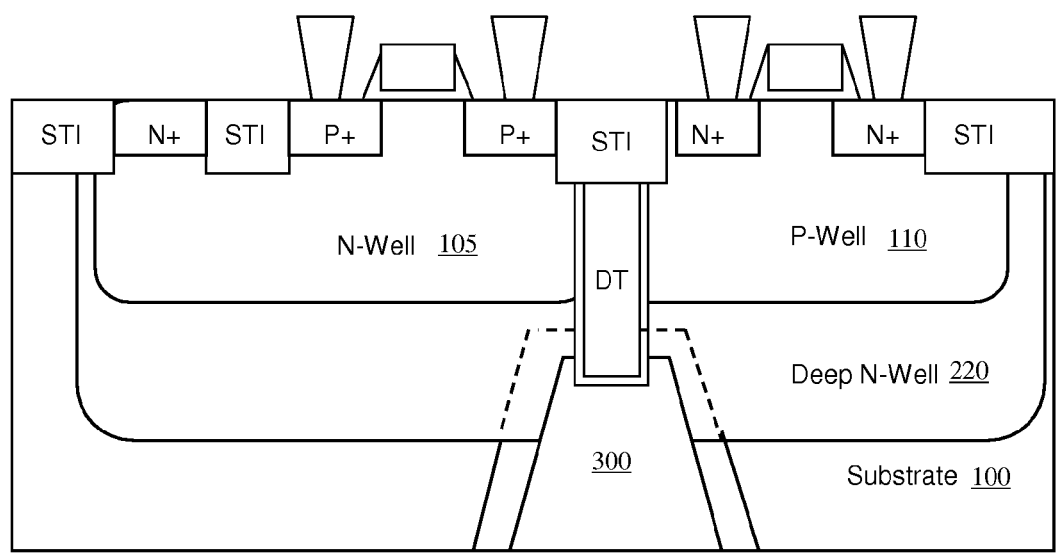
Figure 54:
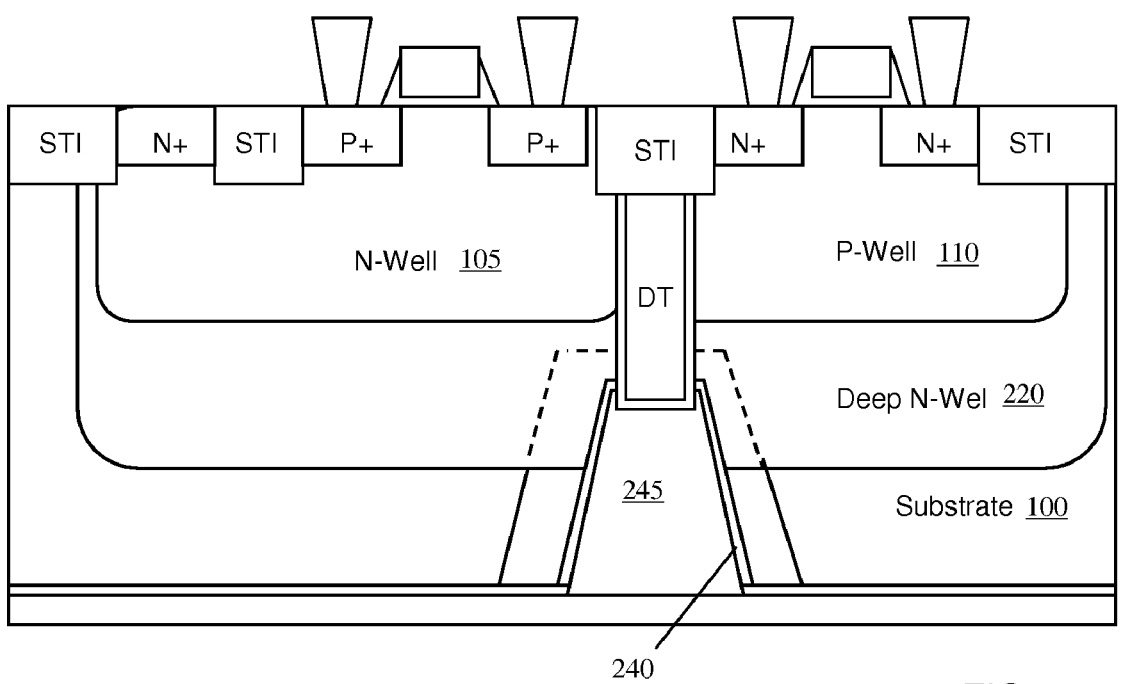

At FIG. 53, standard processing is employed to create circuit elements at the top side of the substrate. Then, as shown in FIG. 54, a barrier metal 240 and conductor 245 are formed in the through wafer via opening 300, to create a deep well through wafer via 225. At this point, the chip may be finished using, for example, conventional back end of line (BEOL) processing techniques.

FIGS. 29-54 describe process flows for forming semiconductor structures having a deep N-well and a deep well through wafer via, similar to the structures shown in FIGS. 26-28. It is noted that similar processing steps can be used in accordance with aspects of the invention to create structures without a deep well, such as the structures shown in FIGS. 5-25. For example, the structures shown in FIGS. 5-25 may be produced using substantially the same processing steps with the exception of not performing the deep well implant, and by appropriately locating the through wafer via trench 300. Moreover, the structures shown in FIGS. 5-25 may be produced with or without depositing a dopant source 305 and performing out-diffusion. Accordingly, the point in the manufacturing process at which the through wafer via trench 300 is formed and filled to create the structures shown in FIGS. 5-25 will depend upon factors such as: manufacturability, reliability, and desired electrical contact performance.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method, comprising:
    forming an NFET device having a P-well at a top side of a substrate;
    forming a PFET device having an N-well at the top side of the substrate; and
    forming a through wafer via from a backside of the substrate to a bottom surface of an isolation structure located between the NFET device and the PFET device, wherein the through wafer via is in contact with the bottom surface of the isolation structure;
    forming a dopant on surfaces of a via opening of the through wafer via; and
    out-diffusing the dopant into the substrate and a deep well.

2. The method of claim 1, wherein the through wafer via is structured and arranged to prevent formation of a parasitic circuit.

3. The method of claim 1, wherein the through wafer via is in contact with and at substantially the same electrical potential as one of the P-well and the N-well, and is not in contact with the other of the P-well and the N-well, respectively.

4. The method of claim 1, wherein:
    the isolation structure comprises a shallow trench isolation (STI) structure, and
    a top portion of the through wafer via contacts a bottom portion of the STI structure.

5. The method of claim 1, wherein:
    the isolation structure comprises a trench isolation (TI) structure formed through a shallow trench isolation (STI) structure, and
    a top portion of the through wafer via contacts a bottom portion of the TI structure.

6. The method of claim 1, wherein:
    the isolation structure comprises a deep trench (DT) structure formed below a shallow trench isolation (STI) structure, and
    a top portion of the through wafer via contacts a bottom portion of the DT structure.

7. The method of claim 1, further comprising forming at least one additional through wafer via from the backside of the substrate to a bottom surface of an additional isolation structure.

8. The method of claim 1, wherein the forming the through wafer via comprises:
    forming the via opening in the substrate;
    forming a barrier metal liner on surfaces of the via opening; and
    filling the via opening with a conductor, wherein the through wafer via includes the barrier metal liner and the conductor.

9. A method, comprising:
    forming an NFET device having a P-well at a top side of a substrate;
    forming a PFET device having an N-well at the top side of the substrate; and
    forming a through wafer via from a backside of the substrate to a bottom surface of an isolation structure located between the NFET device and the PFET device, wherein the through wafer via is in contact with the bottom surface of the isolation structure,
    wherein the forming the through wafer via comprises:
        forming a via opening in the substrate;
        forming a barrier metal liner on surfaces of the via opening; and filling the via opening with a conductor, wherein the through wafer via includes the barrier metal liner and the conductor, further comprising:

depositing a dopant on surfaces of the via opening;

forming a deep well in the substrate; and out-diffusing the dopant into the deep well and the substrate.

10. The method of claim 9, further comprising removing excess dopant from the via opening prior to the forming a barrier metal liner on surfaces of the via opening.

11. The method of claim 9, wherein the out-diffusing creates an electrical contact at an interface of the trench and the deep well, and a high voltage junction at an interface of the trench and the substrate.

12. The method of claim 9, wherein:

the deep well is a deep N-well, and the trench extends through the N-well, the deep N-well, and the substrate.

13. The method of claim 9, wherein:

the dopant comprises doped polysilicon, doped oxides, or doped silicate glasses;

the barrier metal liner comprises refractory metal nitride, refractory metal, or metal silicide; and the deep well extends closer to the backside of the substrate than both the P-well and the N-well.

14. The method of claim 1, further comprising forming a conductive layer on the backside of the substrate, wherein the conductive layer is in contact with the through wafer via.

15. The method of claim 1, wherein a portion of the substrate extends between the P-well and the N-well such that the P-well and the N-well are not adjacent to one another.

16. The method of claim 15, wherein the through wafer via extends into both the P-well and the portion of the substrate between the P-well and the N-well.

17. The method of claim 1, wherein the through wafer via is in contact with the P-well on a first side of the N-well, and further comprising forming a second through wafer via on a second side of the N-well opposite the first side.

18. The method of claim 17, wherein the second through wafer via is not in contact with the N-well.

19. The method of claim 1, wherein a top surface of the through wafer via is in contact with the bottom surface of the isolation structure.

* * * * *